United States Patent
Hanaki et al.

(10) Patent No.: US 9,214,634 B2
(45) Date of Patent: Dec. 15, 2015

(54) ORGANIC PHOTOVOLTAIC CELL, ORGANIC SEMICONDUCTOR POLYMER AND COMPOSITION FOR ORGANIC SEMICONDUCTOR MATERIAL USED THEREFOR

(71) Applicant: FUJIFILM Corporation, Minato-ku, Tokyo (JP)

(72) Inventors: Naoyuki Hanaki, Ashigarakami-gun (JP); Yoshihiro Nakai, Ashigarakami-gun (JP); Kiyoshi Takeuchi, Ashigarakami-gun (JP); Hiroki Sugiura, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/227,460

(22) Filed: Mar. 27, 2014

(65) Prior Publication Data

US 2014/0196787 A1 Jul. 17, 2014

Related U.S. Application Data

(63) Continuation of application No. PCT/JP2012/073501, filed on Sep. 13, 2012.

(30) Foreign Application Priority Data

Sep. 28, 2011 (JP) .................................. 2011-212371

(51) Int. Cl.
*H01L 31/0248* (2006.01)
*H01L 51/00* (2006.01)
*C08K 3/04* (2006.01)
*C08G 61/12* (2006.01)
*H01B 1/12* (2006.01)
*C08L 65/00* (2006.01)

(Continued)

(52) U.S. Cl.
CPC .......... *H01L 51/0036* (2013.01); *C08G 61/123* (2013.01); *C08G 61/126* (2013.01);

(Continued)

(58) Field of Classification Search
CPC ............ H01L 31/0248; H01L 31/0264; H01L 31/0272
USPC .................................................. 136/252, 264
See application file for complete search history.

(56) References Cited

U.S. PATENT DOCUMENTS

2007/0238854 A1  10/2007  Zahn et al.
2009/0107543 A1*  4/2009  Han-Adebekun et al. .... 136/252

FOREIGN PATENT DOCUMENTS

JP      2-180922 A     7/1990
JP      2011-168747 A  9/2011

OTHER PUBLICATIONS

International Search Report for PCT/JP2012/073501 dated Dec. 18, 2012.

*Primary Examiner* — Susan D Leong
(74) *Attorney, Agent, or Firm* — Sughrue Mion, PLLC

(57) ABSTRACT

An organic photovoltaic cell, containing a first electrode; a second electrode; and a photoelectric conversion layer between the first electrode and the second electrode, wherein the photoelectric conversion layer contains a polymer having a structural unit represented by formula (I):

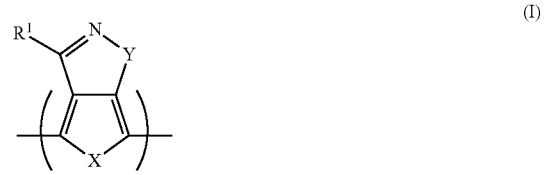

wherein X represents S, $NR^2$, O, Se or Te; Y represents $NR^2$, O, Te, SO, $SO_2$ or CO; and $R^1$ and $R^2$ represent a hydrogen atom or a substituent.

14 Claims, 1 Drawing Sheet

(51) Int. Cl.
*H01L 51/42* (2006.01)
*B82Y 30/00* (2011.01)

(52) U.S. Cl.
CPC ............... C08K 3/04 (2013.01); H01B 1/127 (2013.01); H01B 1/128 (2013.01); H01L 51/0043 (2013.01); *B82Y 30/00* (2013.01); *C08G 2261/91* (2013.01); *C08L 65/00* (2013.01); *H01L 51/4253* (2013.01); *Y02E 10/549* (2013.01); *Y10S 977/735* (2013.01); *Y10S 977/738* (2013.01); *Y10S 977/948* (2013.01)

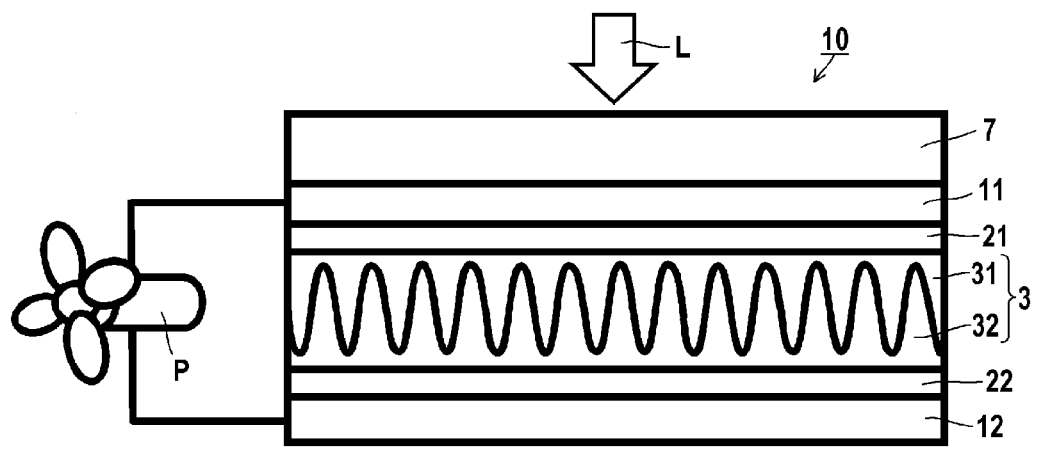

ORGANIC PHOTOVOLTAIC CELL, ORGANIC SEMICONDUCTOR POLYMER AND COMPOSITION FOR ORGANIC SEMICONDUCTOR MATERIAL USED THEREFOR

TECHNICAL FIELD

The present invention relates to an organic photovoltaic cell, an organic semiconductor polymer and a composition for organic semiconductor material used therefor.

BACKGROUND ART

Organic semiconductor polymers have been a subject of active research in recent years in the field of organic electronics, and the polymers are used in organic electroluminescent elements that emit light when electricity is passed, organic photoelectric conversion elements that generate power when irradiated with light, organic thin film transistor elements that control the amount of current or the amount of voltage, and the like. In such an element, as is the case with the inorganic semiconductor material, use is made of an organic semiconductor material obtained by combining a p-type conductive semiconductor material, which is an electron donating material, and an n-type conductive semiconductor material, which is an electron accepting material.

In recent years, since fossil energy of petroleum and the like emit carbon dioxide to the atmosphere, for the purpose of global environment preservation with the suppression of global warming, there is an increasing demand of solar cells. Known examples of organic solar cells that use organic photoelectric conversion elements include a wet type dye-sensitized solar cell (Grätzel cell) and a total solid type organic photovoltaic cell. Since the latter does not use an electrolyte solution, there is no need to take evaporation of this electrolyte solution or liquid leakage into consideration, the solar cell can be made flexible, and the structure of the solar cell or production thereof is more convenient than that of the former.

However, the photoelectric conversion efficiency of organic photovoltaic cells is still insufficient. The photoelectric conversion efficiency is calculated by short circuit current density (Jsc)×open circuit voltage (Voc)×fill factor (FF). In order to increase this efficiency, an increase in the open circuit voltage is also needed along with an increase in the short circuit current density. The short circuit current density is increased when an organic semiconductor material having high solubility and carrier mobility (for example, a compound having a fluorene structure or a silafluorene structure) is used. The open circuit voltage, which is said to be connected with the difference between the HOMO energy level of the p-type conductive semiconductor material and the LUMO energy level of the n-type conductive semiconductor material, is raised when this difference is increased. Furthermore, in the case of an organic solar cell, in order to increase the efficiency, it is efficient to absorb much light from the longer wavelength region (650 nm to 800 nm) of sunlight. Therefore, band gap narrowing is desirable. It is expected that the enhancement of luminescence efficiency, that is, enhancement of the power efficiency of organic electroluminescent lighting for an organic electroluminescent element.

On the other hand, studies on organic semiconductor polymers as p-type conductive semiconductor materials, which are electron donating materials, are in active progress. For example, Patent Literature 1 proposes a polymer having a specific thienoisothiazole structure.

CITATION LIST

Patent Literatures

Patent Literature 1: US Patent Application Publication No. 2007/238854

DISCLOSURE OF INVENTION

Technical Problem

The chemical substance of the above-described Patent Literature 1 is useful as an organic semiconductor polymer. However, the inventors confirmed that the performance of the chemical substance when used in the organic photovoltaic cell is not necessarily satisfactory (refer to Comparative Examples described below). As a result, further improvement of the performance has been desired.

The present invention addresses to the provision of an organic photovoltaic cell which is excellent in both photoelectric conversion efficiency and durability (durability in the presence of oxygen in particular), and which has a small decrease in the photoelectric conversion efficiency even in the case where the cell size is increased. Furthermore, the present invention addresses to the provision of a composition and a polymer each of which is useful as an organic semiconductor material used for the above-described solar cell and the like.

Solution to Problem

The present invention provides the following means:
(1) An organic photovoltaic cell, comprising:
 a first electrode;
 a second electrode; and
 a photoelectric conversion layer between the first electrode and the second electrode,
 wherein the photoelectric conversion layer contains a polymer having a structural unit represented by formula (I):

wherein X represents S, $NR^2$, O, Se or Te; Y represents $NR^2$, O, Te, SO, $SO_2$ or CO; and $R^1$ and $R^2$ represent a hydrogen atom or a substituent.

(2) The organic photovoltaic cell as described in item (1), wherein the polymer is a copolymer.

(3) The organic photovoltaic cell as described in item (2), wherein a copolymer component in the copolymer contains a structure represented by any one of formulae (II-1) to (II-7):

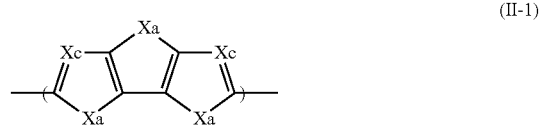

-continued

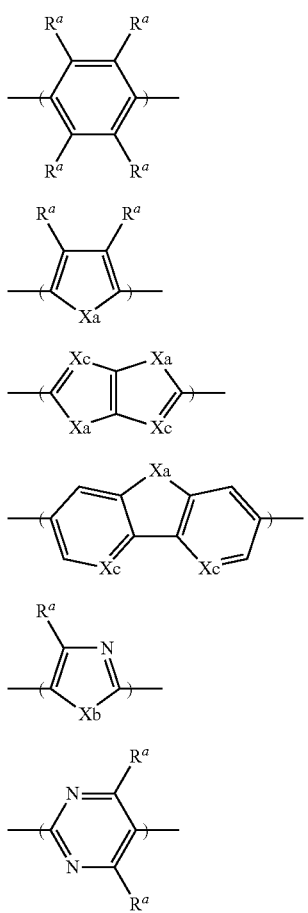

wherein Xa represents C(R$^a$)$_2$, Si(R$^a$)$_2$, S, Se, SO, SO$_2$ or CO; Xb represents NH, O, or S; Xc represents CR$^a$ or N; R$^a$ represents a hydrogen atom or a substituent; and plural R$^a$'s may be linked or condensed to form a ring.

(4) The organic photovoltaic cell as described in any one of items (1) to (3), wherein the photoelectric conversion layer contains an n-type organic semiconductor compound.

(5) The organic photovoltaic cell as described in (4), wherein the n-type organic semiconductor compound is a fullerene or a derivative thereof.

(6) The organic photovoltaic cell as described in (5), wherein the fullerene or the derivative thereof is a phenyl-C$_{61}$-butyric acid ester, a diphenyl-C$_{62}$-bis(butyric acid ester), a phenyl-C$_{71}$-butyric acid ester, a phenyl-C$_{85}$-butyric acid ester, or a thienyl-C$_{61}$-butyric acid ester.

(7) The organic photovoltaic cell as described in any one of items (1) to (6), comprising a hole transport layer between the first electrode and the photoelectric conversion layer.

(8) The organic photovoltaic cell as described in any one of items (1) to (7), comprising an electron transport layer between the second electrode and the photoelectric conversion layer.

(9) The organic photovoltaic cell as described in any one of items (1) to (8), wherein the first electrode is a transparent electrode.

(10) The organic photovoltaic cell as described in any one of items (1) to (9), wherein the second electrode is a metal electrode.

(11) A polymer, comprising a structural unit represented by formula (I):

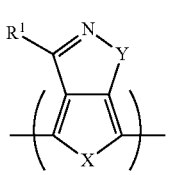

wherein X represents S, NR$^2$, O, Se or Te; Y represents NR$^2$, O, Te, SO, SO$_2$, or CO; and R$^1$ and R$^2$ represent a hydrogen atom or a substituent.

(12) The polymer as described in item (11), wherein the polymer is a copolymer.

(13) The polymer as described in item (12), wherein a copolymer component in the copolymer contains a structure represented by any one of formulae (II-1) to (II-7):

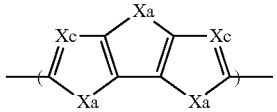

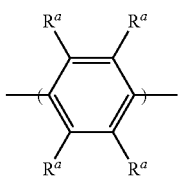

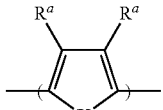

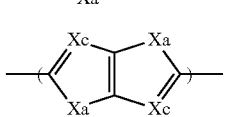

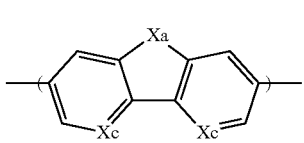

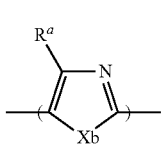

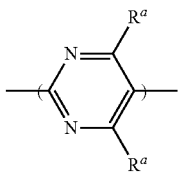

wherein Xa represents C(R$^a$)$_2$, Si(R$^a$)$_2$, S, Se, SO, SO$_2$ or CO; Xb represents NH, O, or S; Xc represents CR$^a$ or N; R$^a$ represents a hydrogen atom or a substituent; and plural R$^a$'s may be linked or condensed to form a ring.

(14) A composition for organic semiconductor material, comprising:
the polymer as described in any one of items (11) to (13); and
fullerene or a derivative thereof.

Advantageous Effects of Invention

The organic photovoltaic cell of the present invention excels in both photoelectric conversion efficiency and durability (durability in the presence of oxygen in particular). Further, the organic photovoltaic cell of the present invention exerts an excellent inhibiting effect on a decrease in photoelectric conversion efficiency even in the case where the cell size is increased as needed. Furthermore, the polymer of the present invention and the composition containing the same are novel, and are useful as a semiconductor material used for the above-described solar cell and the like.

Other and further features and advantages of the invention will appear more fully from the following description, appropriately referring to the accompanying drawing.

BRIEF DESCRIPTION OF THE DRAWING

FIG. 1 is a side view showing schematically a construction of a preferred embodiment of the organic photovoltaic cell according to the present invention.

MODE FOR CARRYING OUT THE INVENTION

For an improvement in efficiency of photoelectric conversion and an enhancement in durability of the organic photovoltaic cell, the present inventors focused attention on the HOMO energy level of a p-type organic semiconductor polymer applied thereto, and investigated various kinds of compounds having such polymer structure. Thus, the inventors confirmed that the HOMO energy level of an organic semiconductor polymer is related to Voc (open circuit voltage) of a solar cell so that as this HOMO energy level is lower, Voc increases, and also confirmed that although an organic semiconductor polymer generally tends to be easily oxidized and deteriorated, when the energy level is lowered, the stability to oxidation caused by oxygen in the atmosphere or the like is enhanced. Meanwhile, the inventors thought that if the LUMO energy is kept low in order to maintain the conversion efficiency and further a narrow band gap is kept, the long-wave shift of an absorption wavelength and an enhancement of durability can be achieved at the same time. Based on the above concept, the inventors investigated polymers capable of achieving this task, and searched out the same, and then reached the completion of the present invention through incorporation of the polymer into a photoelectric conversion layer of the organic photovoltaic cell. Hereinafter, the present invention is explained in detail.
<Organic Photovoltaic Cell>
FIG. 1 is a side view showing schematically one example of the organic photovoltaic cells according to the present invention. The solar cell 10 of the present embodiment has a photoelectric conversion layer (bulk hetero junction layer) 3 containing a polymer represented by the following formula (I). The organic photovoltaic cell is generally classified into a p-i-n junction organic photovoltaic cell having a p-i-n three layer structure and a bulk hetero junction organic photovoltaic cell. In the present invention, either one is acceptable. From the viewpoint that high-power conversion efficiency is easily obtained, the present invention is particularly preferably applied to the bulk hetero junction organic photovoltaic cell as shown in FIG. 1.

In the organic photovoltaic cell of the present embodiment, the photoelectric conversion layer 3 is made up of a p-type semiconductor phase which is composed of the above-described specific polymer and acts as an electron-donating compound and an n-type semiconductor phase acting as an electron-accepting compound. The photoelectric conversion layer 3 is disposed between a first electrode 11 and a second electrode 12. In the present invention, it is preferred that a hole transport layer 21 is disposed between the first electrode and the photoelectric conversion layer, and it is preferred that an electron transport layer 22 is disposed between the second electrode and the photoelectric conversion layer. An effective extraction of the charge generated in the photoelectric conversion layer becomes possible with configuration of both the hole transport layer and the electron transport layer. In the solar cell of the present embodiment, differentiation between the upper side and the downside is not particularly important. However, if needed for descriptive purposes, the first electrode 11 side is defined as an "upper" or "top" side, while the second electrode 12 side is defined as a "down" or "bottom" side.

In the photoelectric conversion layer, as described above, the p-type semiconductor phase weaves with the n-type semiconductor phase in a specific form, and a photoelectric conversion occurs at the interface between them. The form is not particularly limited. To cite an idealistic case, preferred is the state in which the two phases mutually penetrate therein in a pectinate shape of nanometer order, as shown in the FIGURE. In order that such form can be created effectively, it is preferred that the p-type semiconductor has a specific compatibility or non-compatibility with the n-type semiconductor. Further, the material of which the p-type semiconductor is composed is not determined only by its inherent properties, but identified by a relative relation to the material of which the n-type semiconductor is composed. To cite fullerene which is a representative as an n-type semiconductor, a material that has a higher electron-donating property than fullerene may act as a p-type semiconductor material. The above requirements can be favorably satisfied by a polymer represented by the following formula (I).
<Polymer Having a Structural Unit Represented by Formula (I)>
In the present invention, a polymer having a structural unit represented by formula (I) is used.

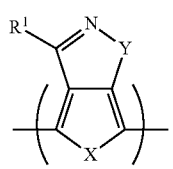

X

In formula (I), X represents S, $NR^2$, O, Se, or Te. Among these, S is preferable. $R^2$ represents a hydrogen atom or a substituent. Preferred examples of the substituent include those exemplified as the substituent T described below.

Y

Y represents $NR^2$, O, Te, SO, $SO_2$ or CO. Among these, $NR^2$ or O is preferable. $R^2$ represents a hydrogen atom or a substituent. Preferred examples of the substituent include those exemplified as the substituent T described below.

R¹

R¹ represents a hydrogen atom or a substituent. Preferred examples of the substituent include those exemplified as the substituent T described below.

Specific examples of the structural unit represented by formula (I) are described below. However, the present invention is not construed by limiting it thereto.

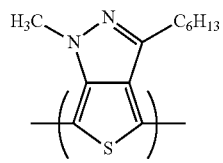
ex1-1

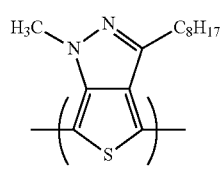
ex1-2

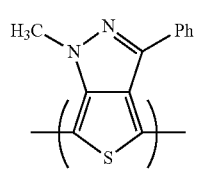
ex1-3

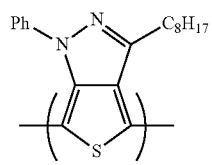
ex1-4

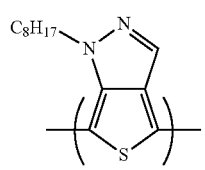
ex1-5

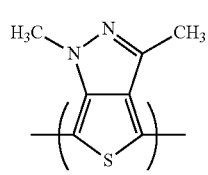
ex1-6

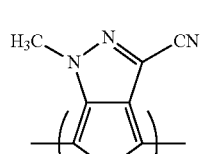
ex1-7

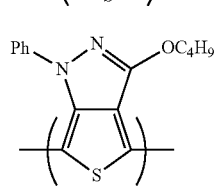
ex1-8

-continued

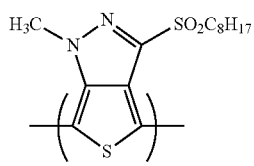
ex1-9

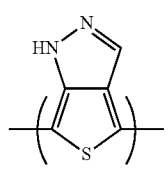
ex1-10

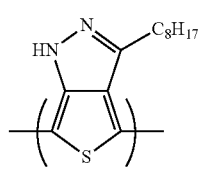
ex1-11

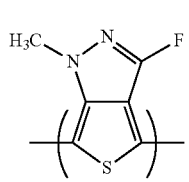
ex1-12

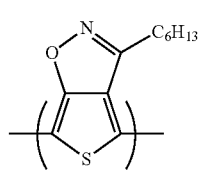
ex1-13

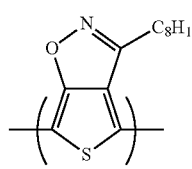
ex1-14

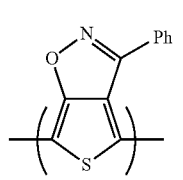
ex1-15

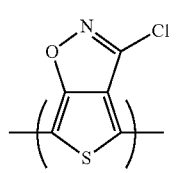
ex1-16

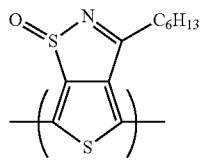
ex1-17 ex1-18 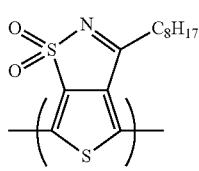
ex1-19 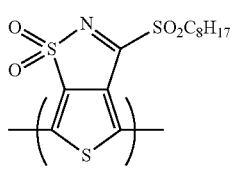
ex1-20 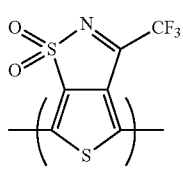
ex1-21 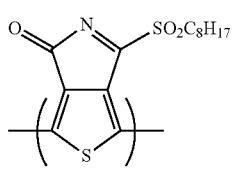
ex1-22 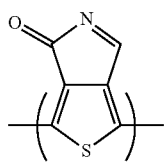
ex1-23 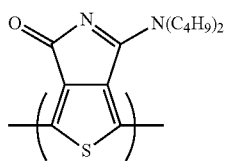
ex1-24 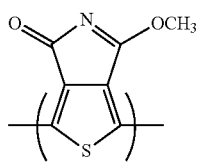
ex1-25 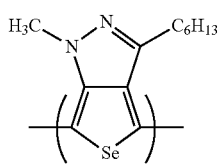
ex1-26 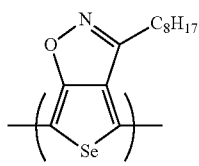
ex1-27 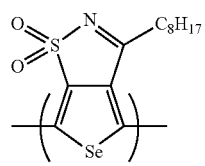
ex1-28 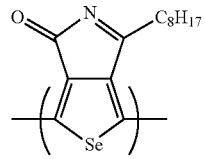
ex1-29 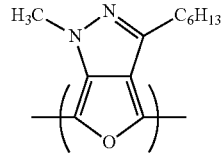
ex1-30 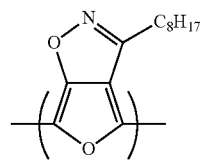
ex1-31 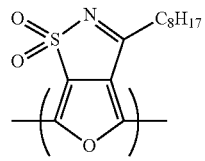
ex1-32 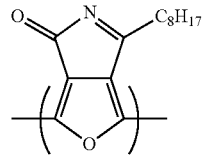
ex1-33 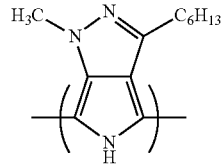
ex1-34 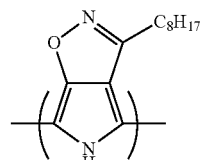
ex1-35 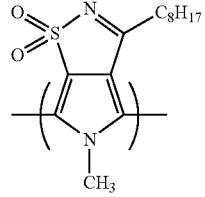

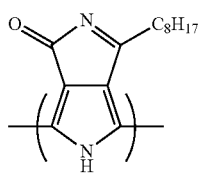

ex1-36

Copolymerization Component

The above-described polymer used in the present invention is preferably a copolymer having a structural unit represented by the above-described formula (I) and another copolymerization component. Examples of the copolymerization component include a silacyclopentadithiophene structural unit, a cyclopentadithiazole structural unit, a benzothiadiazole structural unit, a thiadiazoloquinoxaline structural unit, a cyclopentadithiophene structural unit, a cyclopentadithiophene oxide structural unit, a benzoisothiazole structural unit, a benzothiazole structural unit, a thiophene oxide structural unit, a thienothiophene structural unit, a thienothiophene oxide structural unit, a dithienothiophene structural unit, a dithienothiophene oxide structural unit, a tetrahydroisoindole structural unit, a fluorene structural unit, a fluorenone structural unit, a thiazole structural unit, a selenophene or thiophene structural unit, a silol structural unit, a thiazolothiazole moiety, a thienothiophene structural unit, a naphthothiadiazole structural unit, a thienopyrazine structural unit, an oxazole structural unit, an imidazole structural unit, a pyrimidine structural unit, a benzoxazole structural unit, a benzimidazole structural unit, a thienothiazole structural unit, and a cyclopentadipyridine structural unit. The copolymerization mode is not particularly limited. However, when monomers are two components, formation of an alternate copolymer is preferred.

These structural units are further preferably ones represented by formulae (II-1) to (II-7) described below.

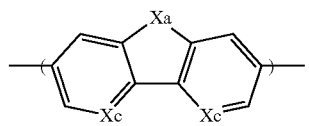
(II-5)

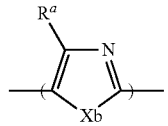
(II-6)

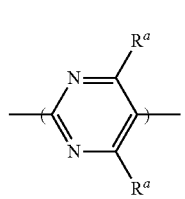
(II-7)

In formulae (II-1) to (II-7), Xa represents $C(R^a)_2$, $Si(R^a)_2$, S, Se, SO, $SO_2$, or CO; Xb represents NH, O, or S; Xc represents $CR^a$ or N; $R^a$ represents a hydrogen atom or a substituent, and $R^{a\prime}$s may be linked to each other or ring-fused to form a ring. When there are plural substituents represented by one symbol, these may be different from one another. When the plural substituents $R^a$ are ring-fused to constitute an aromatic ring or an aromatic hetero ring, a structure which is different from the resonance structure shown above may be created. When $R^a$ represents a substituent, examples of $R^a$ include the substituent T described below, and a preferable range thereof is also the same as the substituent T.

The structural unit represented by formula (II) is further preferably a structural unit represented by any one of formulae (1) to (39).

(II-1)

(1)
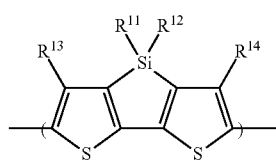

(II-2)

(2)
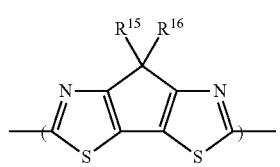

(II-3)

(3)
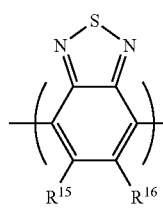

(II-4)

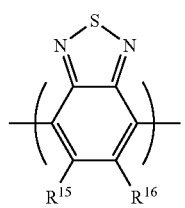

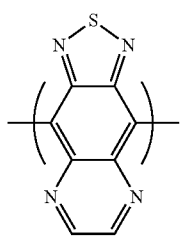
(4)
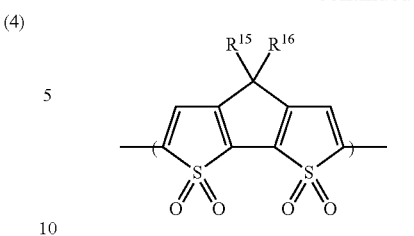
(11)
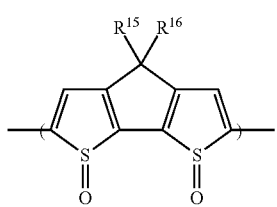
(5)
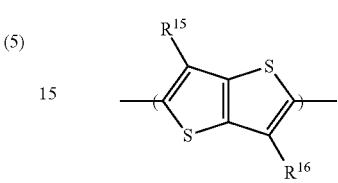
(12)
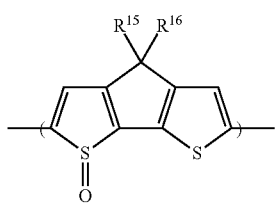
(6)
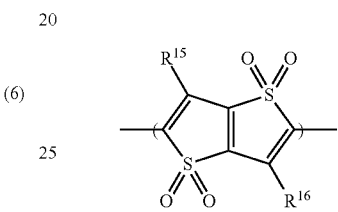
(13)
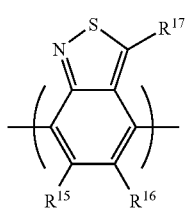
(7)
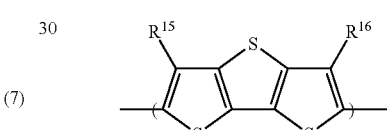
(14)
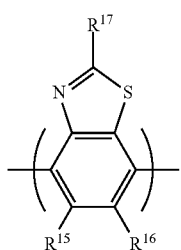
(8)
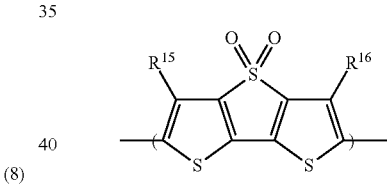
(15)
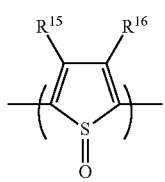
(9)
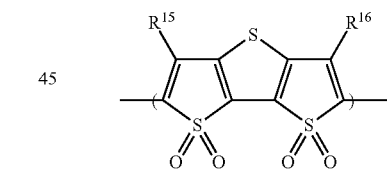
(16)
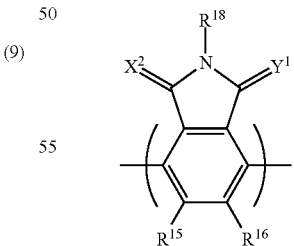
(17)
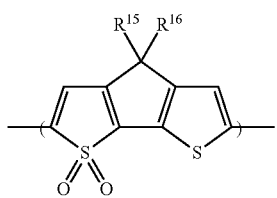
(10)
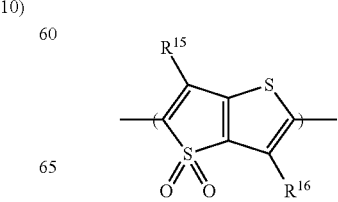
(18)

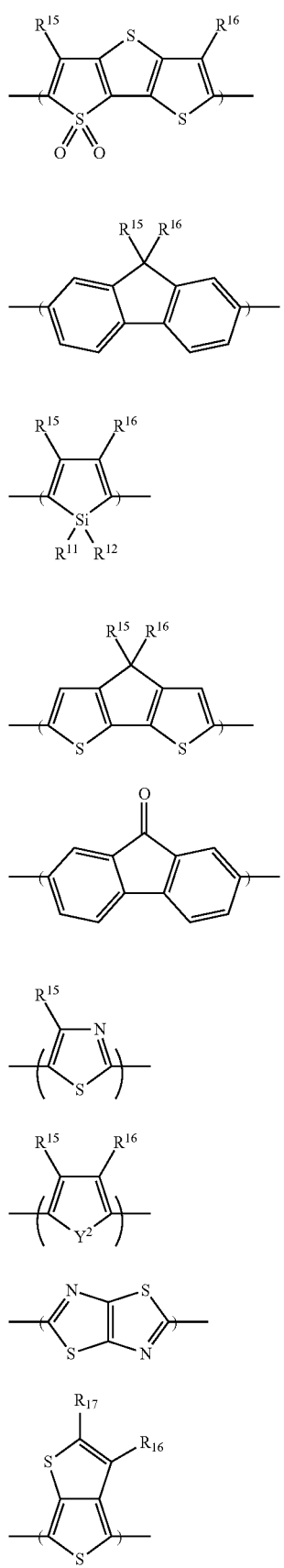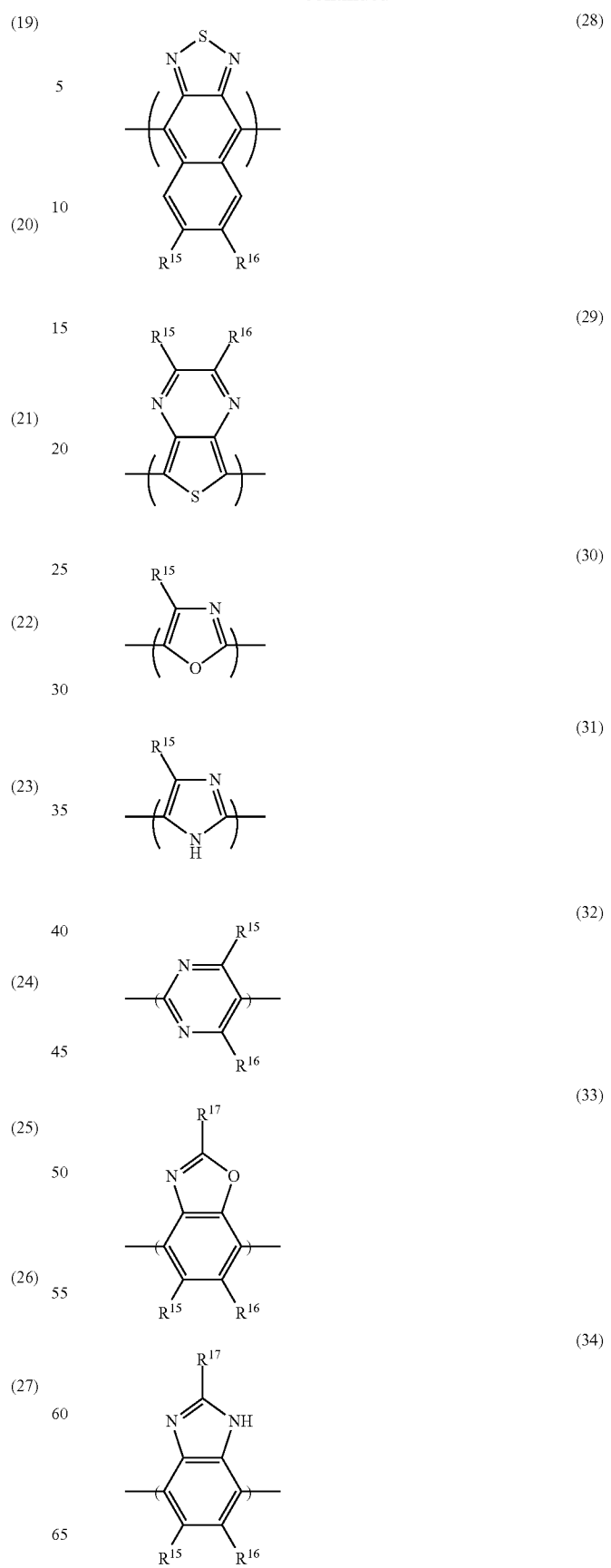

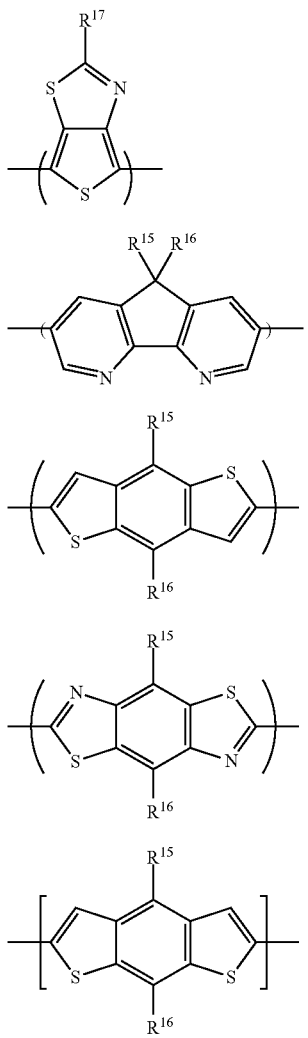

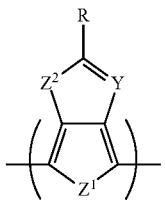

Formula (IIA)

In formulae (1) to (39), $R^{11}$ to $R^{18}$ each represent a hydrogen atom or a substituent exemplified as the substituent T described below. Among these, $R^{11}$ to $R^{18}$ each are preferably a halogen atom, an alkyl group, a cycloalkyl group, an aryl group, a heterocyclic group, an alkoxy group, an aryloxy group, a cyano group, a hydroxyl group, an acyl group, an alkoxycarbonyl group, an aryloxycarbonyl group, or an alkyl- or aryl-sulfonyl group. $R^{13}$ to $R^{17}$ each are further preferably a hydrogen atom, an alkyl group, a cycloalkyl group, an aryl group, a heterocyclic group, an alkoxy group, or an aryloxy group. Preferred examples of each group include those exemplified as the substituent T described below.

$X^2$ and $Y^1$ each independently represent $CH_2$, O or S.

$Y^2$ represents S or Se.

Among these, the structural units represented by (1), (2), (3), (12), (14), (20), (22), (25), (27) and (35) and the structural units represented by formula (IIA) shown below are preferred, and the structural units represented by (1), (20) and (25) and the structural units represented by formula (IIA) shown below are more preferred.

Examples of the copolymerization component also include the structural units represented by the following formula (IIA).

$Z^1$ and $Z^2$

In formula (IIA), $Z^1$ and $Z^2$ each independently represent S, O, Se or Te; more preferably S or O; and most preferably S.

Y

Y is preferably $C(R^{21})$ or N, more preferably N.

R and $R^{21}$

R and $R^{21}$ each independently represent a hydrogen atom or a substituent. Preferred examples of the substituent in R and $R^{21}$ include those exemplified as the substituent T described below. Especially, an alkyl group, a cycloalkyl group, an aryl group and an aromatic heterocyclic group may be exemplified as substituents which R or $R^{21}$ may have.

R is preferably an alkyl group, $-SO_pX^1$, $-CN$, $-NO_2$, $-P(=O)(OR^{22})(OR^{23})$ or $-C(R^{24})=C(CN)_2$, more preferably $-SO_pX^1$, $-CN$, $-NO_2$, $-P(=O)(OR^{22})(OR^{23})$ or $-C(R^{24})=C(CN)_2$. Herein, $X^1$ represents a hydrogen atom, an alkyl group, a cycloalkyl group, an aryl group, an aromatic heterocyclic group, or $-NR^{25}(R^{26})$. $R^{22}$ to $R^{26}$ each independently represent a hydrogen atom, an alkyl group, a cycloalkyl group, an aryl group, or an aromatic heterocyclic group. $R^{25}$ and $R^{26}$ may bind together to form a ring. p represents 1 or 2. p is preferably 2.

Each of the alkyl group, the cycloalkyl group, the aryl group and the aromatic heterocyclic group in $R^{21}$ to $R^{26}$ respectively has the same meaning as the alkyl group, the cycloalkyl group, the aryl group and the aromatic heterocyclic group in the substituent T, and a preferable range is also the same as the substituent T.

From the viewpoint that the obtained polymer film excels in thermal stability, it is more preferred that each of $R^{21}$ to $R^{26}$ and $X^1$ does not contain a double bond such as a vinyl group or an allyl group, an acetylene group, or a cyclic ether group such as an epoxy group or an oxetane group.

In the present invention, it is also preferred to use a copolymerization component represented by the following formula (a) in the copolymer having a structural unit represented by the above-described formula (I).

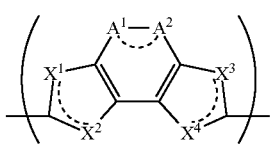

Formula (a)

$X^1$, $X^2$, $X^3$ and $X^4$

In formula (a), $X^1$, $X^2$, $X^3$ and $X^4$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Accordingly, atoms (group) in which the above-described relations are satisfied between $X^1$ and $X^2$ and between $X^3$ and $X^4$ are selected as a combination of $X^1$, $X^2$, $X^3$ and $X^4$.

A¹ and A²

A¹ and A² each independently represent CR, CR$_2$, SiR$^a$, SiR$^a{}_2$, N, NR$^a$, O or S. A¹-A² bond represents a single bond or a double bond.

R each independently represent a hydrogen atom, an alkyl group, a cycloalkyl group, an aryl group, an aromatic heterocyclic group, a hydroxyl group, an alkoxy group, an aryloxy group, a cyano group, an amino group, a nitro group, an alkoxycarbonyl group, an aminocarbonyl group, or an alkyl sulfonyl group, an aryl sulfonyl group, an aminosulfonyl group, or a halogen atom. R$^a$ each independently represent a hydrogen atom, an alkyl group, a cycloalkyl group, an aryl group, or an aromatic heterocyclic group. In a case where two R's bind to the same atom, they may bind together to form a ring, or alternatively may represent the same atom(s) to become =O, =S, =CR$_2$, or =NR$^a$. In a case where two R$^a$'s bind to the same atom, they may bind together to form a ring. R's or R$^a$'s each of which binds to a different atom may bind together to form a ring.

Specific examples of the structural units represented by formula (a) are described below. However, the present invention is not construed by limiting it thereto.

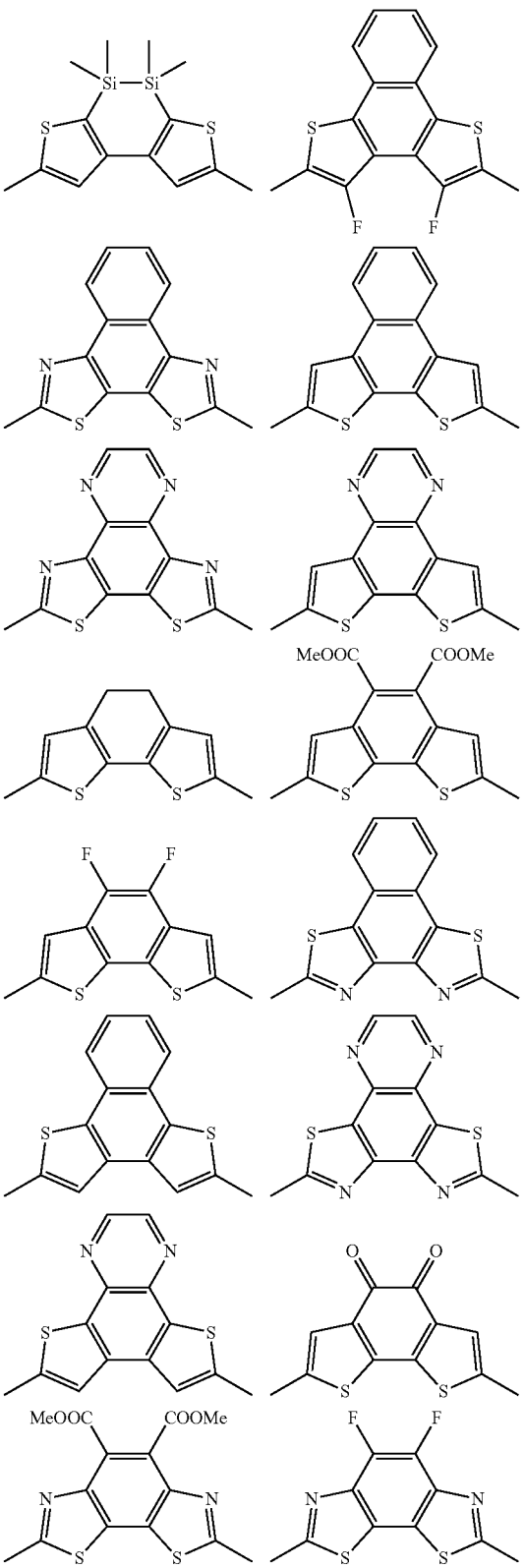

In the present invention, it is also preferred to use a copolymerization component represented by the following formula (b) in the copolymer having a structural unit represented by the above-described formula (I).

Formula (b)

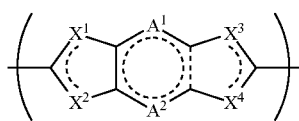

$X^1, X^2, X^3$ and $X^4$

In formula (b), $X^1$, $X^2$, $X^3$ and $X^4$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Accordingly, atoms (group) in which the above-described relations are satisfied between $X^1$ and $X^2$ and between $X^3$ and $X^4$ are selected as a combination of $X^1$, $X^2$, $X^3$ and $X^4$.

$A^1$ and $A^2$ $A^1$ and $A^2$ each independently represent CR, $CR_2$, $SiR^a$, $SiR^a{}_2$, N, $NR^a$, O or S. Each bond in the 6-membered ring containing $A^1$ and $A^2$ represents a single bond or a double bond.

R and $R^a$ have the same meanings as those of formula (a), respectively.

Specific examples of the structural units represented by formula (b) are described below. However, the present invention is not construed by limiting it thereto.

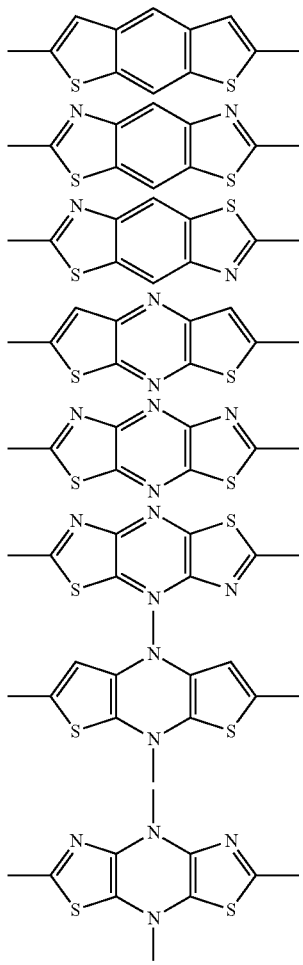

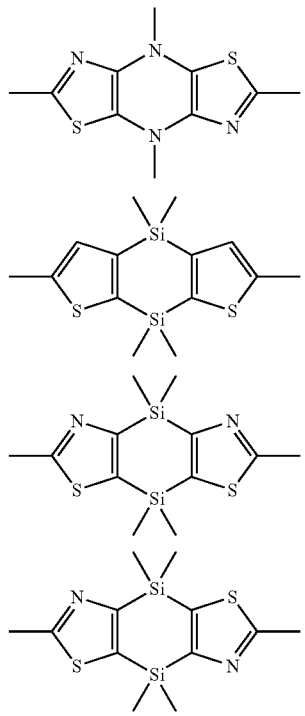

In the present invention, it is also preferred to use a copolymerization component represented by the following formula (c) in the copolymer having a structural unit represented by the above-described formula (I).

Formula (c)

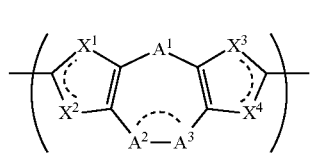

$X^1, X^2, X^3$ and $X^4$

In formula (c), $X^1$, $X^2$, $X^3$ and $X^4$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Accordingly, atoms (group) in which the above-described relations are satisfied between $X^1$ and $X^2$ and between $X^3$ and $X^4$ are selected as a combination of $X^1$, $X^2$, $X^3$ and $X^4$.

$A^1$ $A^1$ represents $CR_2$, $SiR^a{}_2$, $NR^a$, O or S.

$A^2$ and $A^3$ $A^2$ and $A^3$ each independently represent CR, $CR_2$, $SiR^a$, $SiR^a{}_2$, N, $NR^a$, O or S. A bond between $A^2$ and $A^3$ represents a single bond or a double bond.

R and $R^a$ have the same meanings as those of formula (a), respectively.

Specific examples of the structural units represented by formula (c) are described below. However, the present invention is not construed by limiting it thereto.

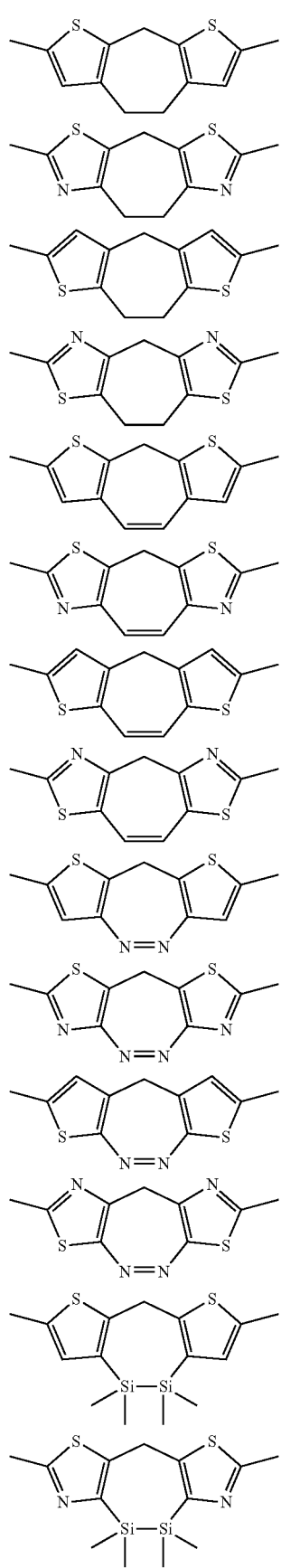
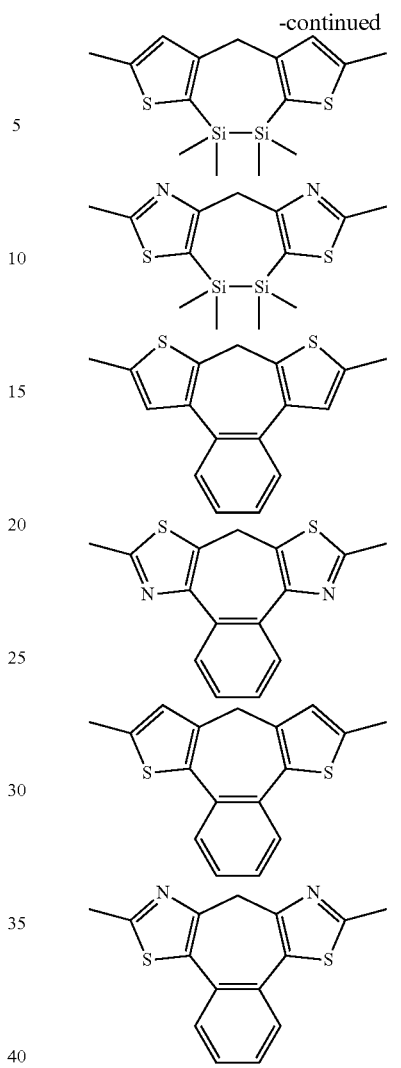

In the present invention, it is also preferred to use a copolymerization component represented by the following formula (d) in the copolymer having a structural unit represented by the above-described formula (I).

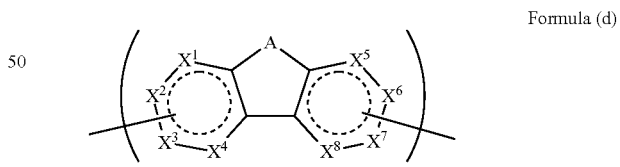

Formula (d)

$X^1$, $X^2$, $X^3$, $X^4$, $X^5$, $X^6$, $X^7$ and $X^8$

In formula (d), $X^1$, $X^2$, $X^3$, $X^4$, $X^5$, $X^6$, $X^7$ and $X^8$ each independently represent Si, S, S=O, O, N, $NR^a$, P, Se, Te, CR or $CR_2$. Each bond in the 6-membered ring containing $X^1$, $X^2$, $X^3$ and $X^4$ and the 6-membered ring containing $X^5$, $X^6$, $X^7$ and $X^8$ represents a single bond or a double bond. However, one of $X^1$, $X^2$, $X^3$ and $X^4$ and one of $X^5$, $X^6$, $X^7$ and $X^8$ each have a single bond for binding to different structural units.

A

A represents $CR_2$, $SiR^a_2$, $NR^a$, O or S.

R and $R^a$ have the same meanings as those of formula (a), respectively.

Specific examples of the structural units represented by formula (d) are described below. However, the present invention is not construed by limiting it thereto.

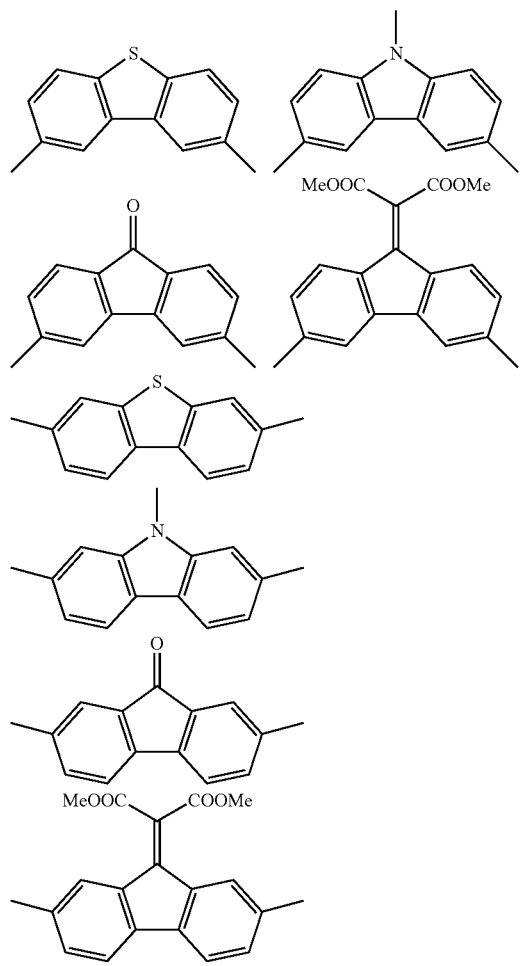

In the present invention, it is also preferred to use a copolymerization component represented by the following formula (e) in the copolymer having a structural unit represented by the above-described formula (I).

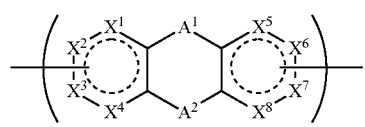

Formula (e)

$X^1$, $X^2$, $X^3$, $X^4$, $X^5$, $X^6$, $X^7$ and $X^8$

In formula (e), $X^1$, $X^2$, $X^3$, $X^4$, $X^5$, $X^6$, $X^7$ and $X^8$ each independently represent Si, S, S=O, O, N, $NR^a$, P, Se, Te, CR or $CR_2$. Each bond in the 6-membered ring containing $X^1$, $X^2$, $X^3$ and $X^4$ and the 6-membered ring containing $X^5$, $X^6$, $X^7$ and $X^8$ represents a single bond or a double bond. However, one of $X^1$, $X^2$, $X^3$ and $X^4$ and one of $X^5$, $X^6$, $X^7$ and $X^8$ each have a single bond for binding to different structural units.

$A^1$ and $A^2$ $A^1$ and $A^2$ each independently represent $CR_2$, $SiR^a$, $NR^a$, O or S.

R and $R^a$ have the same meanings as those of formula (a), respectively.

Specific examples of the structural units represented by formula (e) are described below. However, the present invention is not construed by limiting it thereto.

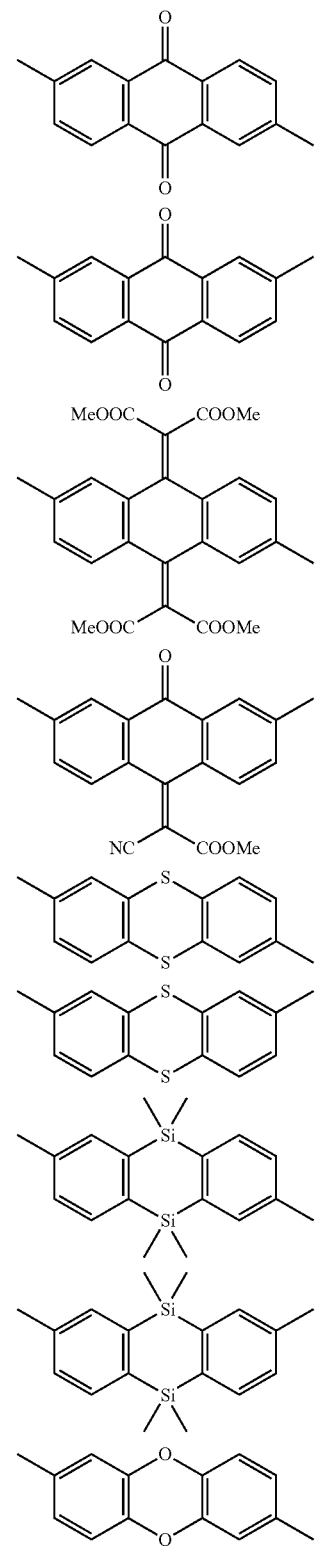

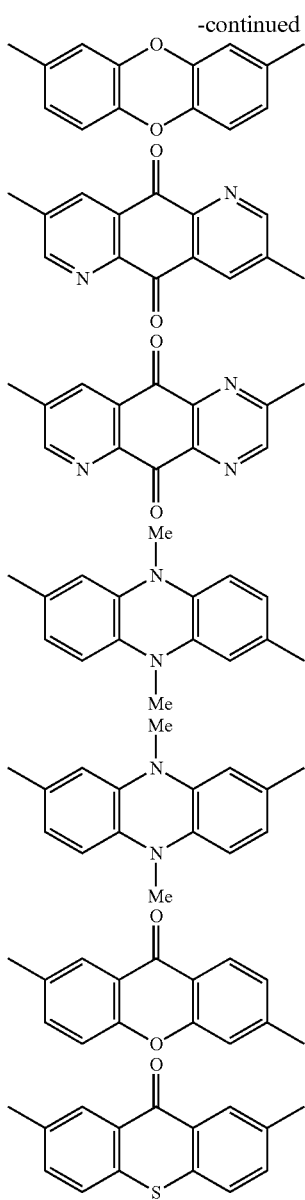

In the present invention, it is also preferred to use a copolymerization component represented by the following formula (f) in the copolymer having a structural unit represented by the above-described formula (I).

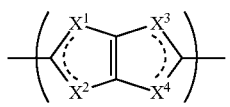

Formula (f)

$X^1$, $X^2$, $X^3$ and $X^4$

In formula (I), $X^1$, $X^2$, $X^3$ and $X^4$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Accordingly, atoms (group) in which the above-described relations are satisfied between $X^1$ and $X^2$ and between $X^3$ and $X^4$ are selected as a combination of $X^2$, $X^3$ and $X^4$.

R and $R^a$ have the same meanings as those of formula (a), respectively.

Specific examples of the structural units represented by formula (f) are described below. However, the present invention is not construed by limiting it thereto.

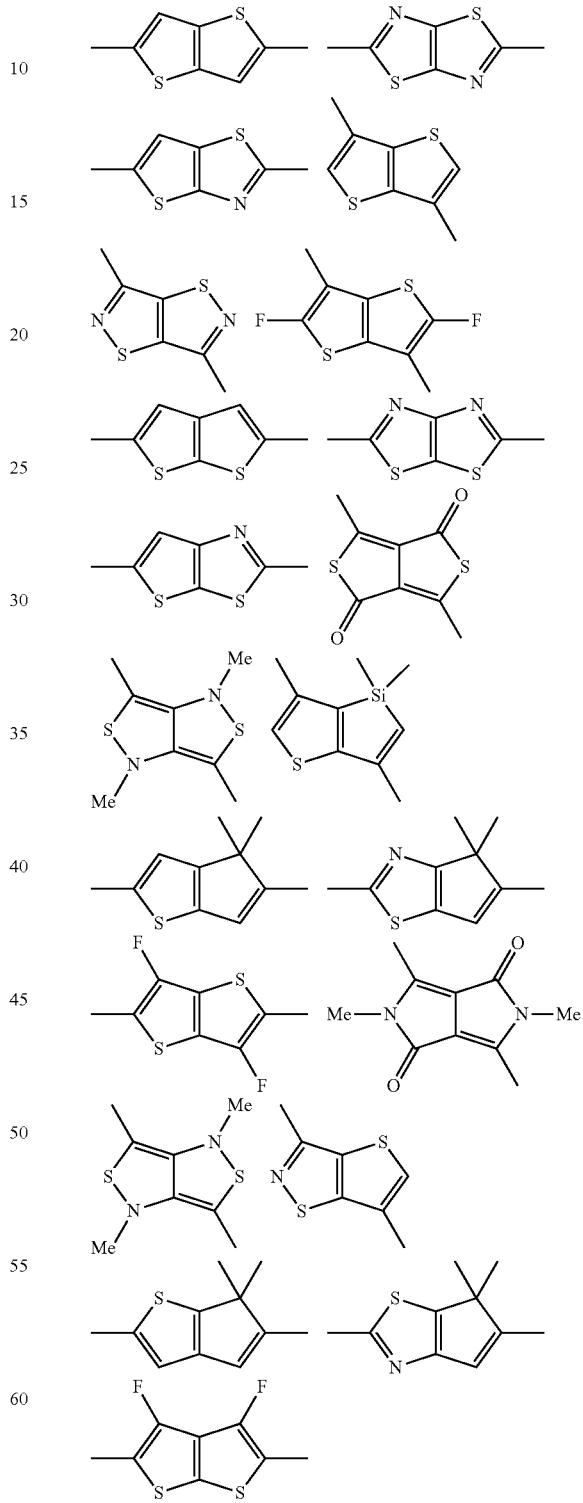

In the present invention, it is also preferred to use a copolymerization component represented by the following formula (g) in the copolymer having a structural unit represented by the above-described formula (I).

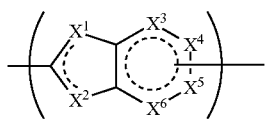

Formula (g)

$X^1, X^2, X^3, X^4, X^5$ and $X^6$

In formula (g), $X^1, X^2, X^3, X^4, X^5$ and $X^6$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Each bond in the 6-membered ring containing $X^3, X^4, X^5$ and $X^6$ represents a single bond or a double bond. Accordingly, atoms (group) in which the above-described relations are satisfied between $X^1$ and $X^2$ are selected as a combination of $X^1$ and $X^2$.

R and $R^a$ have the same meanings as those of formula (a), respectively.

Specific examples of the structural units represented by formula (g) are described below. However, the present invention is not construed by limiting it thereto.

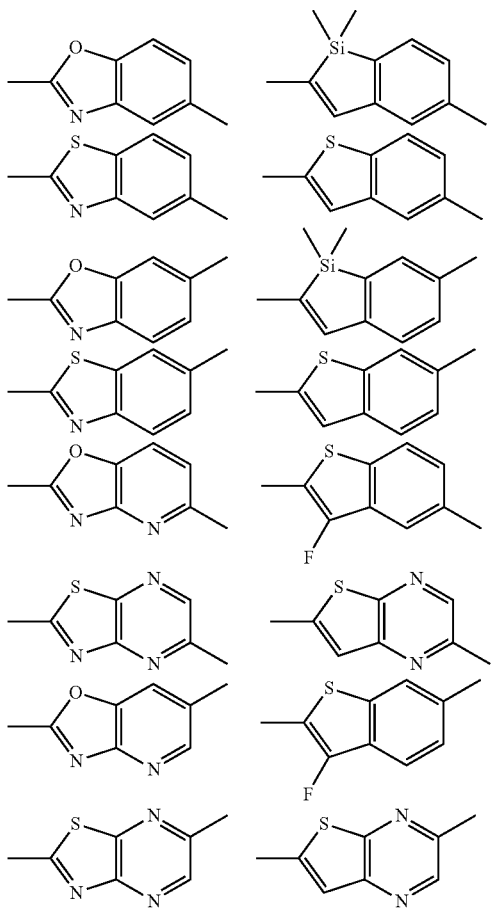

In the present invention, it is also preferred to use a copolymerization component represented by the following formula (h) in the copolymer having a structural unit represented by the above-described formula (I).

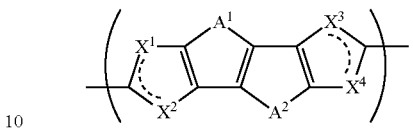

Formula (h)

$X^1, X^2, X^3$ and $X^4$

In formula (h), $X^1, X^2, X^3$ and $X^4$ each independently represent Si, S, S=O, O, N, $NR^a$, P, Se, Te, CR or $CR_2$. A pair of $X^1$—C bond and C—$X^2$ bond and a pair of $X^3$—C bond and C—$X^4$ bond each represent a combination of either one being a single bond and the other being a double bond. Accordingly, atoms (group) in which the above-described relations are satisfied between $X^1$ and $X^2$ and between $X^3$ and $X^4$ are selected as a combination of $X^1, X^2, X^3$ and $X^4$.

$A^1$ and $A^2$ $A^1$ and $A^2$ each independently represent $CR_2$, $SiR^a{}_2$, $NR^a$, O or S.

R and $R^a$ have the same meanings as those of formula (a), respectively.

Specific examples of the structural units represented by formula (h) are described below. However, the present invention is not construed by limiting it thereto.

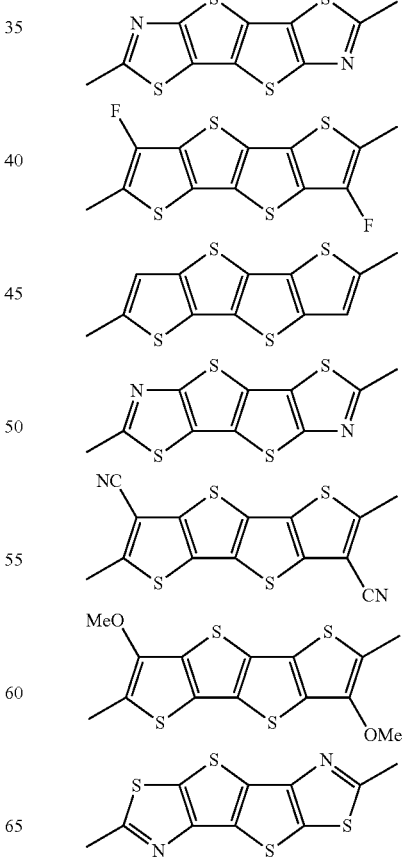

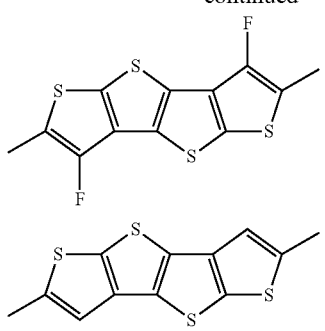
Preferable examples of the copolymer containing the structural unit of the above-described formula (I) are shown below. However, the present invention is not construed as being limited to these examples. In these formulae, m and n stand for copolymerization ratio (molar ratio).
Cop-1
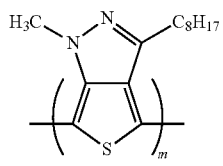
Cop-2
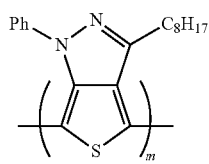
Cop-3
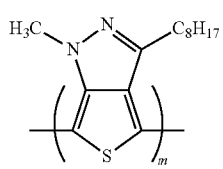
Cop-4
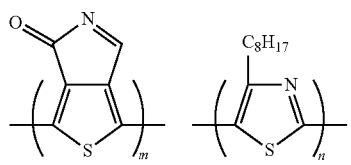
Cop-5
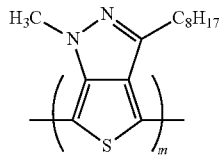
Cop-6
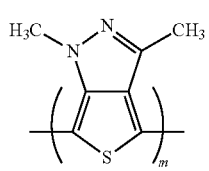
Cop-7
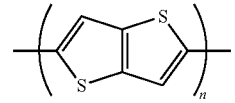
Cop-8
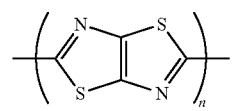
Cop-9
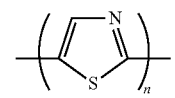
Cop-10
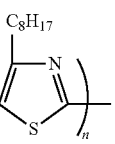
Cop-11
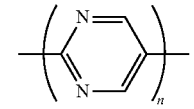
Cop-12
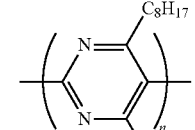
Cop-13
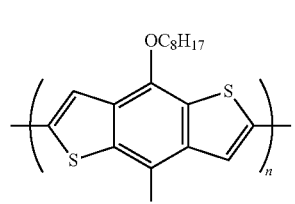
Cop-14
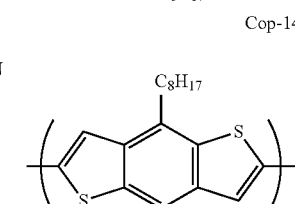

The polymer having a structural unit represented by formula (I) of the present invention can be synthesized using a coupling reaction, for example, a method described in Chemical Reviews, 2002, Vol. 102, page 1358 and the like. That is, the polymer can be synthesized using cross coupling such as Negishi coupling using a zinc reagent, Migita-Kosugi-Stille coupling using a tin reagent, Suzuki-Miyaura coupling using a boron reagent, Kumada-Tamao-Corriu coupling using a magnesium reagent, and Hiyama coupling using a silicon reagent, each of which is carried out under the presence of a transition metal catalyst, or using Ullmann reaction using a copper, or Yamamoto polymerization using a nickel. As the transition metal catalyst, it is possible to use a metal such as palladium, nickel, copper, cobalt, or iron (described in Journal of the American Chemical Society, 2007, Vol. 129, page 9844). Further, the metal may have a ligand. As the ligand, a phosphorus ligand such as $PPh_3$ or $P(t-Bu)_3$ and an N-heterocyclic carbene ligand (described in Angewandte Chemie International Edition, 2002, Vol. 41, page 1290) or the like are preferably used. The metal reagent such as a tin reagent or a boron reagent, which act as a raw material, can be synthesized with reference to Organic Synthesis Collective Volume, 2009, Vol. 11, page 393, ibid. 1998, Vol. 9, page 553, Tetrahedron, 1997, Vol. 53, page 1925, Journal of Organic Chemistry, 1993, Vol. 58, page 904, JP-A-2005-290001 ("JP-A" means unexamined published Japanese patent application), JP-T-2010-526853 ("JP-T" means searched and published International patent publication) and the like. The reaction may be carried out under microwave irradiation as described in Macromolecular Rapid Communications, 2007, Vol. 28, page 387.

The molecular weight of the polymer having the structural unit represented by the above-described formula (I) is not particularly limited, but preferably from 5,000 to 500,000, and more preferably from 10,000 to 100,000, in terms of weight average molecular weight.

Unless it is explicitly stated otherwise, the molecular weight and the degree of dispersion are defined as the values obtained by measurement in accordance with a GPC (Gel Permeation Chromatography) method. The molecular weight is defined as polystyrene-converted weight-average molecular weight. The gel charged into the column used in the GPC method is preferably a gel having an aromatic compound as a repeating unit, and examples thereof include a gel made of styrene-divinylbenzene copolymers. The column is preferably used in the form where 2 to 6 columns are connected. Examples of a solvent used include ether-based solvents such as tetrahydrofuran, amide-based solvents such as N-methylpyrrolidinone, halogen-based solvents such as chloroform, and aromatic solvents such as 1,2-dichlorobenzene. The measurement is preferably carried out at a flow rate of the solvent in the range of from 0.1 to 2 mL/min, and most preferably in the range of from 0.5 to 1.5 mL/min. By carrying out the measurement within these ranges, there is no occurrence of putting a load on an apparatus, and thus, the measurement can be carried out further efficiently. The measurement temperature is preferably carried out at from 10° C. to 50° C., and most preferably from 20° C. to 40° C. The measurement can also be carried out at the temperature from 50° C. to 200° C. using a column having a high temperature available therefor. A column and a carrier to be used can be properly selected, according to the property of a polymer compound to be measured.

In a case where the polymer containing the structural unit represented by formula (I) in the present invention is a copolymer, the copolymerization ratio thereof is not particularly limited, but the molar ratio of the structural unit represented by formula (I) is preferably from 10 to 90% by mole, and preferably from 45 to 55% by mole, of the total.

Since the structural unit represented by formula (I) in the present invention lacks symmetry, position regularity due to a difference in the binding mode occurs in the polymer containing this structural unit. In the present invention, only one representative binding mode is described, but the present invention is not construed to a limited extent by this binding mode. The copolymer may be any one of a random copolymer, an alternate copolymer, a block copolymer and a periodic copolymer, but preferably an alternate copolymer and a periodic copolymer, and more preferably an alternate copolymer.

The expression of a compound and a polymer used in the present specification means to include, in addition to the compound and the polymer themselves, their salts, their complexes, and substances in ionic states. Further, they mean to include their derivatives which have been modified in a predetermined configuration to the extent that a desired effect is produced. Furthermore, in regard to a substituent (including a linking group) that is not specified to be substituted or unsubstituted in the present specification, this means that the group may have an optional substituent. This also similarly applies to a compound and a polymer that are not specified to be substituted or unsubstituted. Examples of preferred substituent include those of the substituent T shown below.

The substituent T includes the following substituents.

The substituents include an alkyl group (preferably an alkyl group having 1 to 20 carbon atom(s), for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, for example, 2-pyridyl, 4-pyridyl, 2-imidazolyl, 2-benzimidazolyl, 2-thiazolyl, and 2-oxazolyl), an alkoxy group (preferably an alkoxy group having 1 to 20 carbon atom(s), for example, methoxy, ethoxy, isopropyloxy, and benzyloxy), an aryloxy group (preferably an aryloxy group having 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group having 0 to 20 carbon atom(s), for example, amino, N,N-dimethylamino, N,N-diethylamino, N-ethylamino, and anilino), a sulfonamide group (preferably a sulfonamide group having 0 to 20 carbon atom(s), for example, N,N-dimethylsulfonamide, and N-phenylsulfonamide), an acyloxy group (preferably an acyloxy group having 1 to 20 carbon atom(s), for example, acetyloxy and benzoyloxy), a carbamoyl group (preferably a carbamoyl group having 1 to 20 carbon atom(s), for example, N,N-dimethylcarbamoyl and N-phenylcarbamoyl), an acylamino group (preferably an acylamino group having 1 to 20 carbon atom(s), for example, acetylamino and benzoylamino), a cyano group and a halogen atom (for example, a fluorine atom, a chlorine atom, a bromine atom, and an iodine atom). Among them, an alkyl group, an alkenyl group, an aryl group, a heterocyclic group, an alkoxy group, an aryloxy group, an alkoxycarbonyl group, an amino group, an acylamino group, a cyano group, and a halogen atom are more preferable. An alkyl group, an alkenyl group, a heterocyclic group, an alkoxy group, an alkoxycarbonyl group, an amino group, an acylamino group, and a cyano group are particularly preferable.

<Organic Semiconductor Polymer>

A polymer having the structural unit represented by formula (I) of the present invention is useful as an organic semiconductor polymer. An organic semiconductor polymer is a polymer of an organic compound capable of exhibiting the properties as a semiconductor, and the polymer of the present invention is particularly useful as a p-type organic semiconductor polymer. Meanwhile, a p-type organic semiconductor compound, including a polymer, is generally a π-electron conjugated compound having a highest occupied molecular orbital (HOMO) energy level of 4.5 eV to 6.0 eV.

Organic semiconductor polymers are used in organic electroluminescent elements that emit light when electricity is passed, organic photoelectric conversion elements that generate power when irradiated with light, organic thin film transistor elements that control the amount of current or the amount of voltage, electrochemical sensors, printable circuits, and the like, which are used in the field of organic electronics. In the present invention, it is preferable to use organic semiconductor polymer in photovoltaic cells, and particularly in organic photovoltaic cells.

<Composition for Organic Semiconductor Material>

The composition for organic semiconductor material of the present invention will be described.

The polymer having a structural unit represented by formula (I) of the present invention is useful as a p-type organic semiconductor polymer, and the composition for organic semiconductor material of the present invention contains this polymer having a structural unit represented by formula (I) and an n-type semiconductor compound, and particularly according to the present invention, it is preferable that the composition for organic semiconductor material contains an n-type organic semiconductor compound. Furthermore, if necessary, the composition for organic semiconductor material may contain a p-type organic semiconductor compound other than the polymer having a structural unit represented by formula (I), and a compound other than semiconductor (for example, examples of the other p-type semiconductor compound include poly-3-hexylthiophene (P3HT), poly[2-methoxy-5-(2-ethylhexyloxy)-1,4-phenylenevinylene (MEH-PPV), poly[2-methoxy-5-(3',7'-dimethyloctyloxy)-1,4-phenylenevinylene] (MDMO-PPV), poly[(9,9-di-n-octylfluorenyl-2,7-diyl)-alt-(benzo[2,1,3]thiadiazole-4,8-diyl)] (F8BT); and examples of the compound other than semiconductor include other polymers such as a polyester-based resin and a methacrylic resin that will be described below).

The content of the polymer having the structural unit represented by formula (I) is not particularly limited, but the polymer having the structural unit represented by formula (I) is preferably contained in the proportion of from 10 to 90% by mass, and more preferably from 30 to 70% by mass, providing that the total mass of the composition is 100.

The n-type semiconductor compound is preferably contained in the proportion of from 10 to 90% by mass, and more preferably from 30 to 70% by mass, providing that the total mass of the composition is 100. Any of the p-type semiconductor compounds other than the polymer having the structural unit represented by formula (I) is preferably contained in the proportion of from 0 to 50% by mass, and more preferably from 0 to 30% by mass. The compound other than the semiconductor may be contained in the proportion of from about 0 to about 50% by mass, although the amount depends on its ingredient.

Meanwhile, a composition in the present invention means that two or more components are substantially uniformly present at a specific constitution. Herein, being substantially uniform means that each component may be unevenly distributed to the extent that the function effect of the present invention is provided. Furthermore, regarding the composition, as long as the definition described above is satisfied, the form is not particularly limited. That is, the form is not limited to a fluid liquid or paste and the composition means to include a solid, a powder and the like, all containing plural components. Furthermore, even in a case where a precipitate is present, the term composition means to include something of which dispersed state is maintained for a predetermined time by stirring.

<Member of Organic Photovoltaic Cell>
(N-Type Organic Semiconductor Compound)

There are no particular limitations on the n-type organic semiconductor compound. Generally, the n-type organic semiconductor compound is a π-electron conjugated compound having a lowest unoccupied molecular orbital (LUMO) energy level of 3.5 eV to 4.5 eV, and examples thereof include fullerene or a derivative thereof; octaazaporphyrin; perfluoro compounds obtained by substituting the hydrogen atoms of a p-type organic semiconductor compound with fluorine atoms (for example, perfluoropentacene or perfluorophthalocyanine); and polymer compounds containing aromatic carboxylic acid anhydrides or imidation products thereof as skeletal structures, such as naphthalenetetracarboxylic acid anhydride, naphthalenetetracarboxylic acid diimide, perylenetetracarboxylic acid anhydride, and perylenetetracarboxylic acid diimide.

Among these n-type organic semiconductor compounds, fullerene or a derivative thereof is preferred, and fullerene or a derivative thereof is more preferred, so that electrical charge separation from the organic semiconductor polymer having a structural unit represented by formula (I) of the present invention (p-type organic semiconductor compound) can be achieved rapidly and efficiently.

Examples of the fullerene or the derivative thereof include fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nanotube and a fullerene derivative a part of which is substituted with a hydrogen atom, a halogen atom, a substituted or unsubstituted alkyl group, alkenyl group, alkynyl group, aryl group, heteroaryl group, cycloalkyl group, silyl group, ether group, thioether group, amino group or silyl group.

As the fullerene derivative, a phenyl-$C_{61}$-butyric acid ester, a diphenyl-$C_{62}$-bis(butyric acid ester), a phenyl-$C_{71}$-butyric acid ester, a phenyl-$C_{85}$-butyric acid ester, or a thienyl-$C_{61}$-butyric acid ester is preferred, and the number of carbon atoms of the alcohol moiety of the butyric acid esters is preferably 1 to 30, more preferably 1 to 8, even more preferably 1 to 4, and most preferably 1.

Preferred examples of the fullerene derivative include phenyl-$C_{61}$-butyric acid methyl ester ([60]PCBM), phenyl-$C_{61}$-butyric acid n-butyl ester ([60]PCBnB), phenyl-$C_{61}$-butyric acid isobutyl ester ([60]PCBiB), phenyl-$C_{61}$-butyric acid n-hexyl ester ([60]PCBH), phenyl-$C_{61}$-butyric acid n-octyl ester ([60]PCBO), diphenyl-$C_{62}$-bis(butyric acid methyl ester)(bis[60]PCBM), phenyl-$C_{71}$-butyric acid methyl ester ([70]PCBM), phenyl-$C_{85}$-butyric acid methyl ester ([84]PCBM), thienyl-$C_{61}$-butyric acid methyl ester ([60]ThCBM), $C_{60}$ pyrrolidine tris-acid, $C_{60}$ pyrrolidine tris-acid ethyl ester, N-methylfulleropyrrolidine (MP-$C_{60}$), (1,2-methanofullerene $C_{60}$)-61-carboxylic acid, (1,2-methanofullerene $C_{60}$)-61-carboxylic acid t-butyl ester, metallocene-involved fullerene of JP-A-2008-130889 and the like, and fullerene having a cyclic ether group of U.S. Pat. No. 7,329,709 and the like.

(P-Type Organic Semiconductor Compound)

The composition for organic semiconductor material of the present invention may contain another p-type semiconductor compound (for example, a condensed low-molecular weight polycyclic aromatic compound, oligomer or polymer), together with the polymer having a structural unit represented by formula (I) of the present invention.

Examples of the condensed low-molecular weight polycyclic aromatic compound as the p-type semiconductor compound include compounds such as anthracene, tetracene, pentacene, hexacene, heptacene, chrysene, picene, fulminene, pyrene, peropyren, perylene, terrylene, quaterrylene, coronene, ovalene, circumanthracene, bisanthene, zethrene, heptazethrene, pyranthrene, violanthene, isoviolanthene, circobiphenyl, and anthradithiophene; porphyrin or copper phthalocyanine, tetrathiafulvalene (TTF)-tetracyanoquinodimethane (TCNQ) complex, bisethylenetetrathiafulvalene (BEDTTTF)-perchloric acid complex, and derivatives or precursors thereof.

(Photoelectric Conversion Layer)

The composition for organic semiconductor material of the present invention is preferably used as a composition for coating of a photoelectric conversion layer (particularly a bulk hetero junction layer). The mixing ratio of the p-type organic semiconductor compound which is an electron donating material, to the n-type semiconductor compound which is an electron accepting material is adjusted such that the photoelectric conversion efficiency would become the highest. Usually, the mixing ratio is selected from the range of 10:90 to 90:10, and preferably 20:80 to 80:20, as a mass ratio. Regarding the method for forming such a mixed layer, for example, a co-deposition method is used. Alternatively, the mixed layer can also be formed by a coating method using a solvent which can dissolve both the organic materials. In order to increase the area of the interface at which charge separation of holes and electrons occurs, and to obtain high photoelectric conversion efficiency, a coating method is preferred.

Herein, for the purpose of promoting the phase separation of the electron donating region (donor) and the electron accepting region (acceptor) in the photoelectric conversion layer, crystallization of the organic materials contained in the photoelectric conversion layer, transparentization of the electron transport layer, and the like, the photoelectric conversion layer may be subjected to a heating treatment (annealing) by various methods. In the case of a dry film forming method such as deposition, for example, there is a method of adjusting the substrate temperature to 50° C. to 150° C. during film formation. In the case of a wet film forming method such as printing or coating, there is a method of adjusting the drying temperature after coating to 50° C. to 150° C. Furthermore, the photoelectric conversion layer may also be heated to 50° C. to 150° C. in a post-process, for example, after completion of the formation of a metal negative electrode. As the phase separation is promoted, the carrier mobility increases, and high photoelectric conversion efficiency can be obtained.

(Electrode)

The photoelectric conversion element according to the present invention includes at least a first electrode and a second electrode. The first electrode and the second electrode are such that any one of them serves as a positive electrode, and the other serves as a negative electrode. Furthermore, in the case of adopting a tandem configuration, a tandem configuration can be achieved by using an intermediate electrode. Meanwhile, in the present invention, the electrode through which primarily holes flow is referred to as a positive electrode, while the electrode through which primarily electrons flow is referred to as a negative electrode. Furthermore, from the aspect of function of having light transmissibility or not, an electrode having light transmissibility is referred to as a transparent electrode, and an electrode having no light transmissibility is referred to as a counter electrode or a metal electrode. Usually, the positive electrode is a transparent electrode having light transmissibility, while the negative electrode is a counter electrode or a metal electrode having no light transmissibility. However, both the first electrode and the second electrode can be made into transparent electrodes.

(First Electrode)

The first electrode is a cathode. In the case using it for a solar cell, it is preferably an electrode transmitting a light of from visible light to near infrared light (380 to 800 nm). Examples of a material which can be used include transparent conductive metal oxides such as indium tin oxide (ITO), $SnO_2$, and ZnO; a metal nanowire; and a carbon nanotube. Further, there can be used a conductive polymer selected from the group consisting of derivatives of polypyrrole, polyaniline, polythiophene, polythienylene vinylene, polyazulene, polyisothianaphthene, polycarbazole, polyacethylene, polyphenylene, polyphenylene vinylene, polyacene, polyphenylacetylene, polydiacetylene, and polynaphthalene. Furthermore, a plural number of these electrically conductive compounds can be combined, and the combination can be used in the positive electrode. Meanwhile, in the case where light transmissibility is not required, the positive electrode may be formed using a metal material such as nickel, molybdenum, silver, tungsten, or gold. In the case where a transparent solar cell is to be produced, the transmittance of the positive electrode is preferably such that the average light transmittance at the thickness used in solar cells (for example, a thickness of 0.2 μm) in the wavelength range of 380 nm to 800 nm is preferably 75% or more, and further preferably 85% or more.

(Second Electrode)

The second electrode of the present invention is a negative electrode.

The negative electrode may be an independent layer made of a conductive material, in addition to the material which has conductivity, there can be used a resin which holds such material together. As a conducting material used for a negative electrode, there can be used a metal, an alloy, an electric conductive compound, and a mixture thereof, which have a small work function (4 eV or less). Specific examples of such electrode material include sodium, a sodium potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and a rare earth metal. Among these, from the viewpoint of an electron taking out property and resistivity to oxidation, a mixture of these metals and the second metal having a larger work function than these metals is suitable. Examples of these include a magnesium/silver mixture, a magnesium/aluminum mixture, a magnesium/indium mixture, an aluminum/aluminum oxide ($Al_2O_3$) mixture, a lithium/aluminum mixture and aluminum. A negative electrode can be produced by using these electrode materials with a method such as a vapor deposition method or a sputtering method. Moreover, the coating thickness is usually chosen from the range of 10 nm to 5 μm, preferably from the range of 50 to 200 nm.

When a metallic material is used as a conducting material of the negative electrode, the light arriving at the negative electrode side will be reflected and will be also reflected by the first electrode side, and this light can be reused. As a result, the light is again absorbed by the photoelectric conversion layer to result in improvement of photoelectric conversion efficiency. This is desirable. Moreover, the negative electrode may be nanoparticles, nanowires, or nanostructures which are made of a metal (for example, gold, silver, copper, platinum, rhodium, ruthenium, aluminum, magnesium and indium) and carbon. When it is a dispersion of nanowires, a transparent and high conductive negative electrode can be formed by a coating method, and it is preferable.

When the negative electrode side is made to be light transparent, it can be achieved as follows. After producing thin film of a conductive material suitable for negative electrodes, such as aluminum, an aluminum alloy, silver or a silver compound to have a coating thickness of about 1 to 20 nm, a light transmitting negative electrode can be prepared by providing on the thin film with a membrane of a conductive light transparent material cited in the description of the above-mentioned positive electrode.

(Hole Transport Layer)

In the present invention, it is preferable to provide a hole transport layer between the first electrode and the photoelectric conversion layer.

Examples of the electrically conductive polymer that forms the hole transport layer include polythiophene, polypyrrole, polyaniline, polyphenylenevinylene, polyphenylene, polyacetylene, polyquinoxaline, polyoxadiazole, polybenzothiadiazole, and polymers having a plural number of these conductive skeletal structures.

Among these, polythiophene and derivatives thereof are preferred, and polyethylenedioxythiophene and polythienothiophene are particularly preferred. These polythiophenes are usually partially oxidized in order to obtain electrical conductivity. The electrical conductivity of the conductive polymer can be regulated by the degree of partial oxidation (doping amount), and as the doping amount increases, electrical conductivity increases. Since polythiophene becomes cationic as a result of partial oxidation, a counter anion for neutralizing the electrical charge is required. Examples of such a polythiophene include polyethylenedioxythiophene having polystyrene sulfonic acid as a counter ion (PEDOT-PSS), and polyethylenedioxythiophene having p-toluenesulfonic acid as a counter anion (PEDOT-TsO).

(Electron Transport Layer)

In the present invention, it is preferable to provide an electron transport layer between the second electrode and the photoelectric conversion layer, and it is particularly preferable to provide a hole transport layer between the first electrode and the photoelectric conversion layer and to provide an electron transport layer between the photoelectric conversion layer and the second electrode.

Examples of the electron transporting material that can be used in the electron transport layer include the n-type semiconductor compounds described above in the photoelectric conversion layer, which are electron accepting materials, and the materials described as electron-transporting and hole-blocking materials in Chemical Review, Vol. 107, pp. 953-1010 (2007). In the present invention, it is preferable to use an inorganic salt or an inorganic oxide. Preferred examples of the inorganic salt include alkali metal compounds such as lithium fluoride, sodium fluoride, and cesium fluoride. Various metal oxides are preferably used as materials for electron transport layer having high stability, examples thereof include lithium oxide, magnesium oxide, aluminum oxide, calcium oxide, titanium oxide, zinc oxide, strontium oxide, niobium oxide, ruthenium oxide, indium oxide, zinc oxide, and barium oxide. Among these, relatively stable aluminum oxide, titanium oxide, and zinc oxide are more preferred. The film thickness of the electron transport layer is 0.1 nm to 500 nm, and preferably 0.5 nm to 300 nm. The electron transport layer can be suitably formed by any of a wet film forming method based on coating or the like, a dry film forming method according to a PVD method such as deposition or sputtering, a transfer method, a printing method, and the like.

Meanwhile, the electron transport layer that has a HOMO energy level that is deeper than the HOMO energy level of the p-type semiconductor compound used in the photoelectric conversion layer, is imparted with a hole blocking function of having a rectification effect in which holes produced in the photoelectric conversion layer are not passed to the negative electrode side. More preferably, the material having the HOMO energy level deeper than the HOMO energy level of the n-type semiconductor compound is used as the electron transport layer. Further, in view of the characteristics of transporting electrons, it is preferable to use a compound having high electron mobility. Such an electron transport layer is also called a hole blocking layer, and it is preferable to use an electron transport layer having such a function. As such a material, phenanthrene-based compounds such as bathocuproine; n-type semiconductor compounds such as naphthalenetetracarboxylic acid anhydride, naphthalenetetracarboxylic acid diimide, perylenetetracarboxylic acid anhydride, and perylenetetracarboxylic acid diimide; n-type inorganic oxides such as titanium oxide, zinc oxide, and gallium oxide; and alkali metal compounds such as lithium fluoride, sodium fluoride, and cesium fluoride, can be used. Furthermore, a layer formed from a simple substance of the n-type semiconductor compound used in the photoelectric conversion layer can also be used.

(Support)

The support that constitutes the photovoltaic cell of the present invention is not particularly limited as long as at least a first electrode (positive electrode), a photoelectric conversion layer, and a second electrode (metal negative electrode), and in a more preferred embodiment, a first electrode (positive electrode), a hole transport layer, a photoelectric conversion layer, an electron transport layer, and a second electrode (metal negative electrode), can be formed on the support and retained thereon. For example, the support can be appropriately selected from a glass plate, a plastic film and the like according to the purpose.

Additionally, in accordance with application of layers in common use, an easy adhesion layer/an undercoat layer, a functional layer, a recombination layer, another semiconductor layer, a protective layer, a gas-barrier layer or the like may be provided thereon.

The polymer having a structural unit represented by formula (I) of the present invention and the photovoltaic cell have been described, and in some embodiments, the polymer having a structural unit represented by formula (I) of the present invention can be used in other elements and systems. For example, such a polymer can be used in suitable organic semiconductor elements such as field effect transistors, photodetectors (for example, infrared light detectors), photovoltaic detectors, image pickup elements (for example, RGB image pickup elements of cameras or medical image pickup systems), light emitting diodes (LED) (for example, organic LED's or infrared or near-infrared LED's), laser elements, conversion layers (for example, layers that convert visible light emission to infrared light emission), amplifier radiators for electric communication (for example, doping agent for fibers), memory elements (for example, holographic memory elements), and electrochromic elements (for example, electrochromic displays).

EXAMPLES

The present invention will be described in more detail based on examples given below, but the invention is not meant to be limited by these.

Synthesis Example

Synthesis of Polymer 1

The homopolymer (Polymer 1) derived from Compound A as a monomer was synthesized with reference to the method described in Macromolecules, 1992, Vol. 25, pp. 1214 to 1223. Herein, the Compound A was synthesized referring to the method described in Chemische Berichte, 1991, Vol. 124, pp. 2481 to 2488.

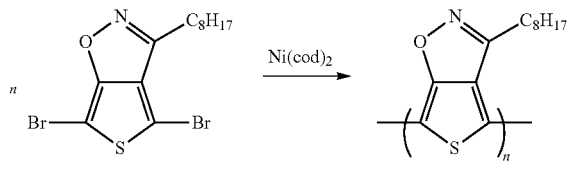

Synthesis of Polymer 2

The homopolymer (Polymer 2) derived from Compound B as a monomer was synthesized in the same manner as Polymer 1. Herein, the Compound B was synthesized referring to the method described in Japanese Patent No. 4414881.

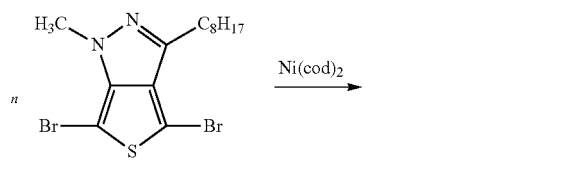

Synthesis of Polymer 3

The homopolymer (Polymer 3) derived from Compound C as a monomer was synthesized in the same manner as Polymer 1. Herein, the Compound C was synthesized referring to the method described in Journal of the Chemical Society, Perkin Transactions 1, 1994, Vol. 21, pp. 3065 to 3070.

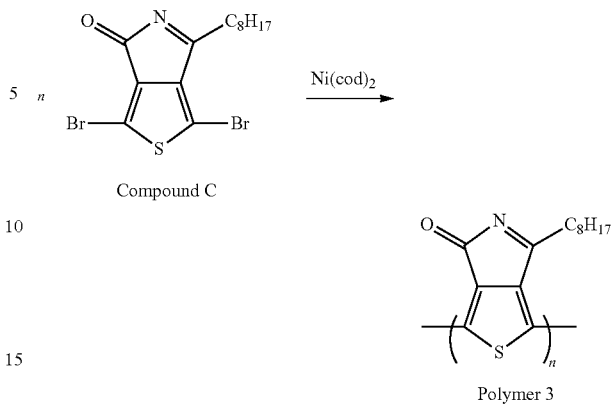

Synthesis of Polymer 4

The homopolymer (Polymer 4) derived from Compound D as a monomer was synthesized in the same manner as Polymer 1. Herein, the Compound D was synthesized referring to the method described in European Journal of Medicinal Chemistry, 1988, Vol. 23, pp. 329 to 334.

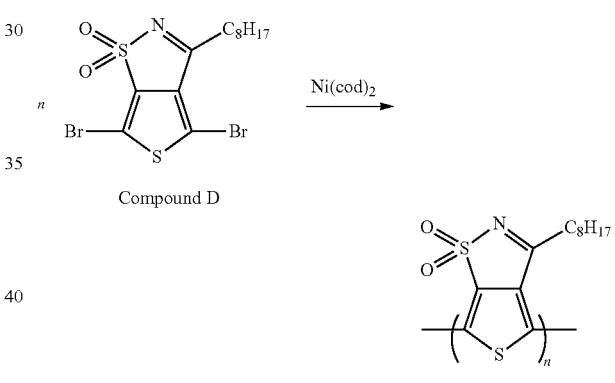

Synthesis of Polymer 5

The copolymer (Polymer 5) derived from Compound B and Compound E as monomers was synthesized with reference to the method described in Journal of the American Chemical Society, 2008, Vol. 130, pp. 7670 to 7685. Herein, the Compound E was synthesized referring to the method described in Journal of the American Chemical Society, 2008, Vol. 130, pp. 7670 to 7685.

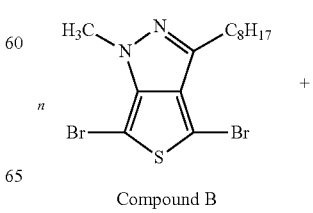

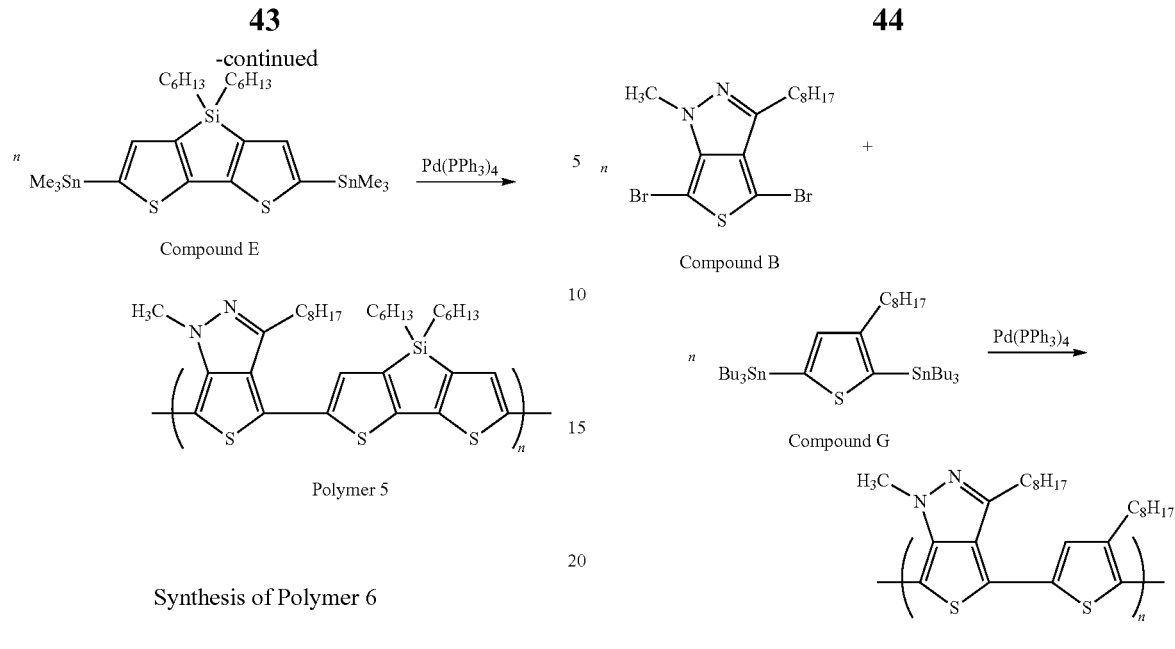

Synthesis of Polymer 6

The copolymer (Polymer 6) derived from Compound B and Compound F as monomers was synthesized with reference to the method described in JP-A-2011-116961. Herein, a reagent produced by Sigma-Aldrich Co. was used as the Compound F.

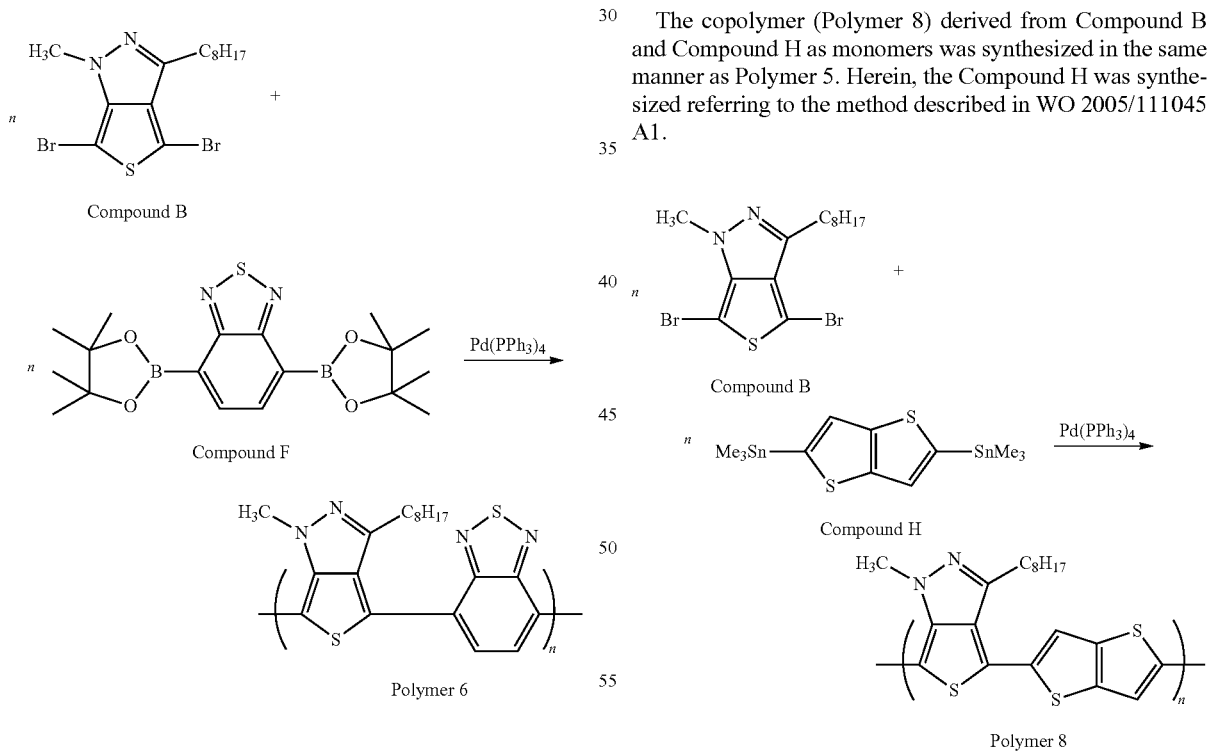

Synthesis of Polymer 7

The copolymer (Polymer 7) derived from Compound B and Compound G as monomers was synthesized in the same manner as Polymer 5. Herein, the Compound G was synthesized referring to the method described in Journal of the American Chemical Society, 1998, Vol. 120, pp. 5355 to 5362.

Synthesis of Polymer 8

The copolymer (Polymer 8) derived from Compound B and Compound H as monomers was synthesized in the same manner as Polymer 5. Herein, the Compound H was synthesized referring to the method described in WO 2005/111045 A1.

Synthesis of Polymer 9

The copolymer (Polymer 9) derived from Compound B and Compound I as monomers was synthesized in the same manner as Polymer 6. Herein, the Compound I was synthesized referring to the method described in EP 1762553 A1.

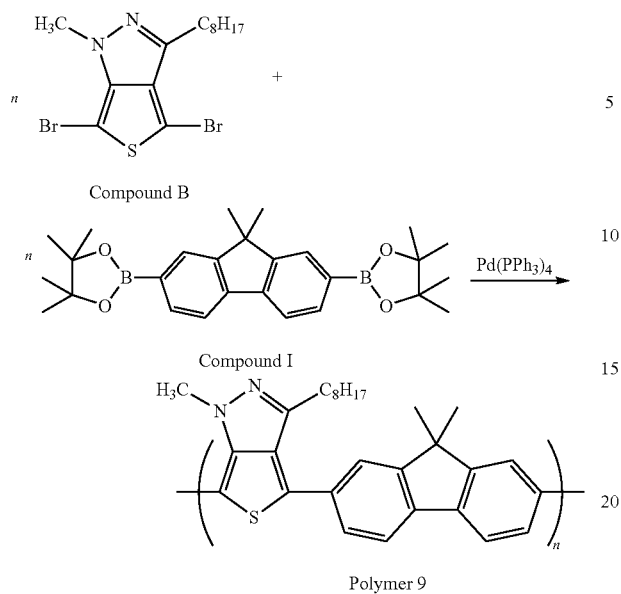

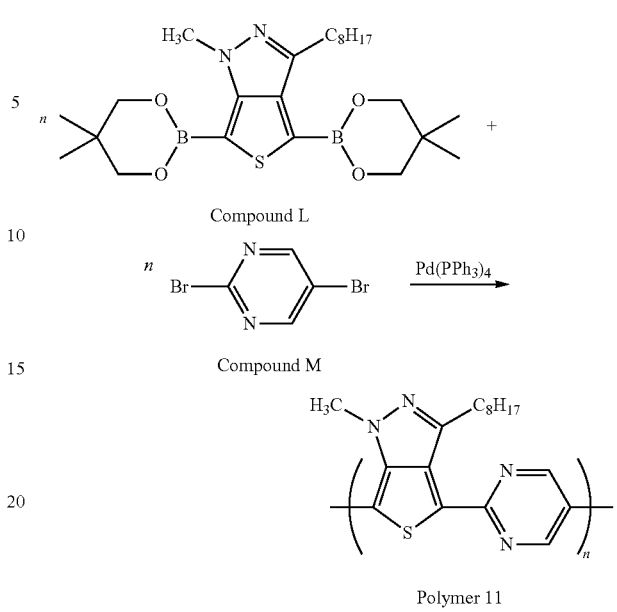

Synthesis of Polymer 10

The copolymer (Polymer 10) derived from Compound B and Compound J as monomers was synthesized in the same manner as Polymer 5. Herein, the Compound G was synthesized referring to the method described in Synthesis, 1987, p. 185.

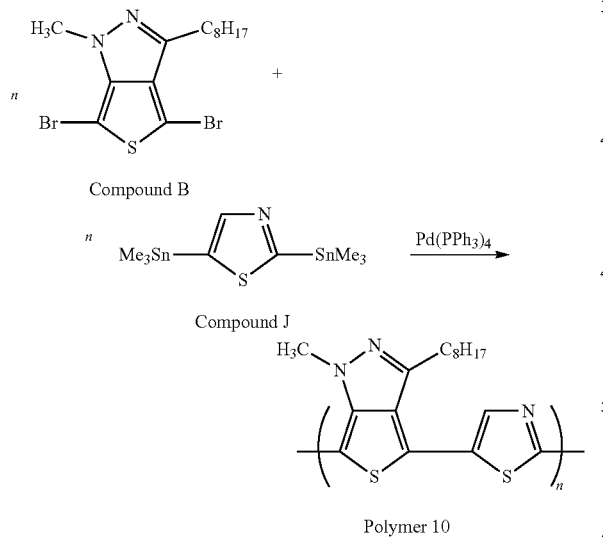

Synthesis of Polymer 11

The copolymer (Polymer 11) derived from Compound L and Compound M as monomers was synthesized in the same manner as Polymer 6. Herein, the Compound L was synthesized from the Compound B referring to the method described in Journal of Organic Chemistry, 2010, Vol. 75, pp. 5438 to 5452, and the Compound M was synthesized referring to the method described in WO 2005/123673A1, respectively.

Synthesis of Polymer 12

The copolymer (Polymer 12) derived from Compound B and Compound N as monomers was synthesized in the same manner as Polymer 5. Herein, the Compound N was synthesized referring to the method described in Journal of the American Chemical Society, 2009, Vol. 131, pp. 7792 to 7799.

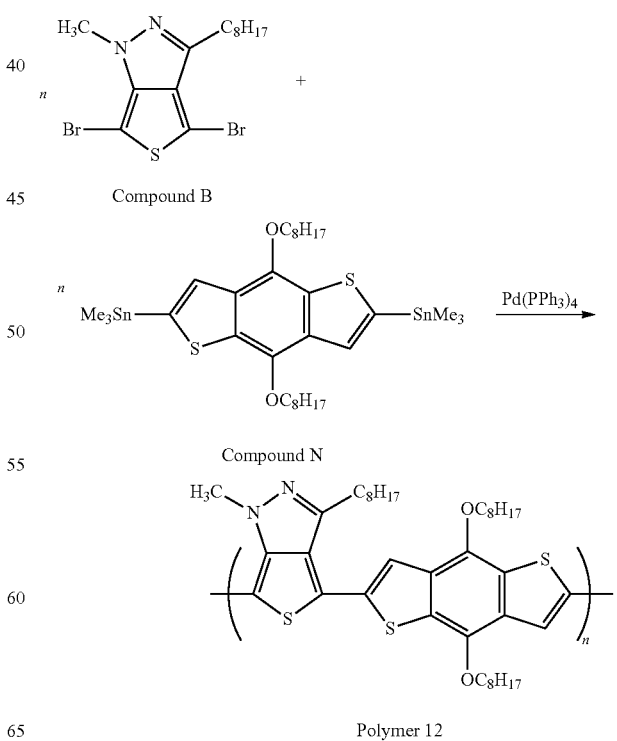

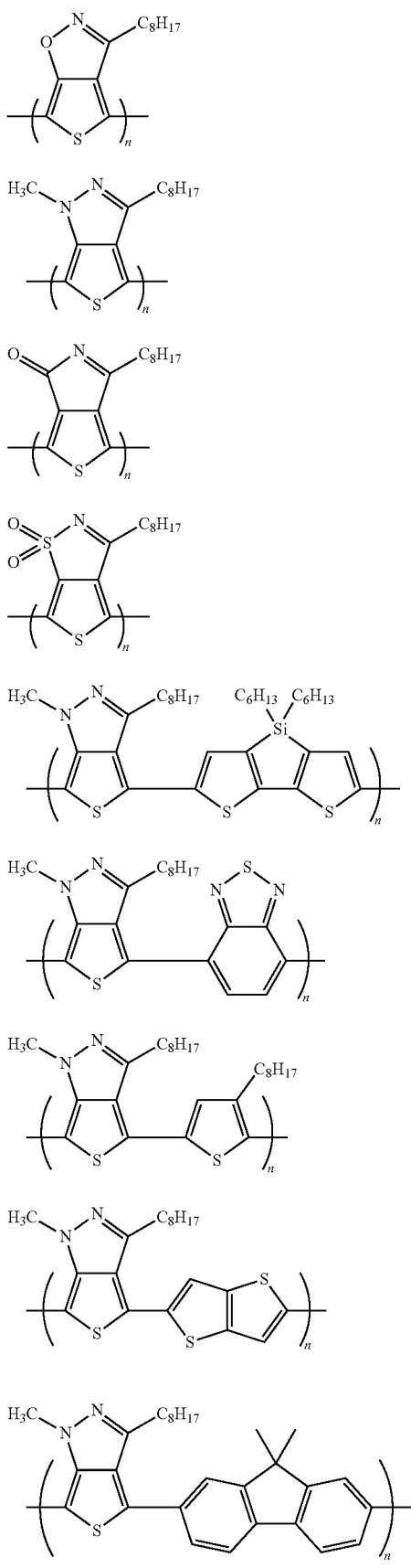

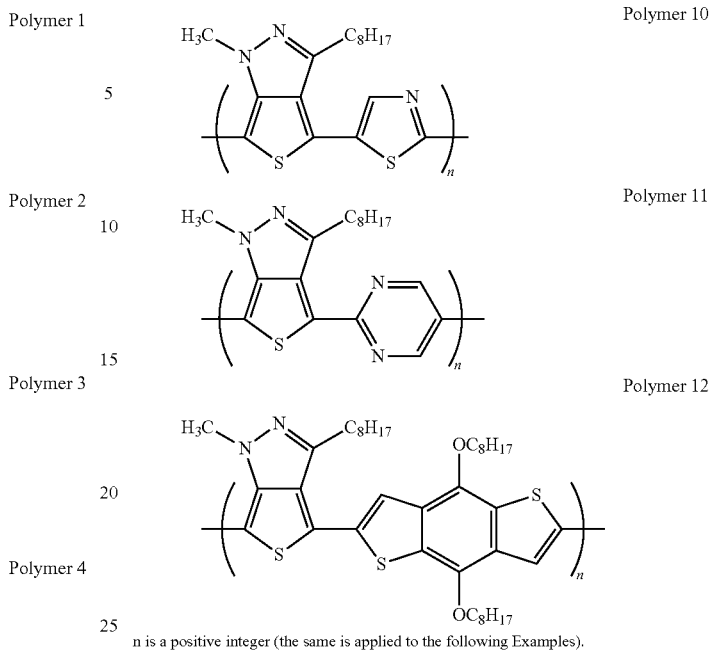

n is a positive integer (the same is applied to the following Examples).

Synthesis of Comparative Polymer A

The following Comparative polymer A was synthesized referring to the method described in US 2007/238854 (pp. 5 to 6).

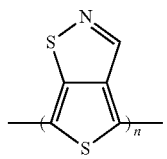

Synthesis of Comparative Polymer B

The following Comparative polymer B was synthesized referring to the method described in JP-A-2008-202053 (pp. 14 to 15).

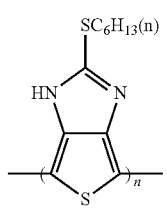

Synthesis of Comparative Polymer C

The following Comparative polymer C was synthesized referring to the method described in US 2007/238854 (pp. 5 to 6).

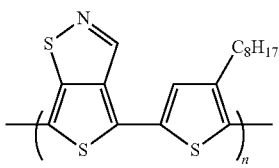

Synthesis of Comparative Polymer D

The following Comparative polymer D was synthesized referring to the method described in JP-A-2008-202053 (pp. 14 to 15) and Journal of the American Chemical Society, 2008, Vol. 130, pp. 7670 to 7685.

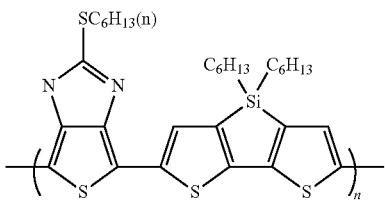

(Production of Photovoltaic Cell)

Photovoltaic cells were formed on glass ITO substrates by the following procedure, using the polymers described in Table 1 below.

On a clean, UV-ozone-treated ITO glass substrate, a PEDOT:PSS (CleviosP VP AI4083 of H.C. Stark GmbH) layer to be used as a hole transport layer was spin-coated and dried for 15 minutes at 120° C.

Subsequently, a mixture (mass ratio 1:1) of one of the p-type semiconductor polymers and PC61BM ([60]PCBM manufactured by Solenne BV) was dissolved in o-dichlorobenzene, and then the solution was spic-coated on the PEDOT:PSS layer and dried for 15 minutes at 120° C. Thus, a photoelectric conversion layer was formed.

Furthermore, a dehydrated ethanol solution (2 mass %) of titanium isopropoxide (manufactured by Sigma-Aldrich Co.) was spic-coated on this photoelectric conversion layer, and the photoelectric conversion layer was dried for one hour at room temperature. Thus, an electron transport layer of a titanium oxide layer was formed.

Thereafter, an upper electrode was formed by high vacuum deposition of aluminum, and thereby a photovoltaic element was obtained.

At this time, two kinds of elements, namely a 2-mm square element and a 20-mm square element, were produced by changing the size of the glass ITO substrate used, and the pattern size of the ITO and deposited aluminum.

(Evaluation of Photovoltaic Cell)

(1) Current Density-Voltage (J-V) Characteristics of Element

The 2-mm square element and the 20-mm square element respectively produced as described above were subjected to a performance evaluation as follows.

For the elements thus obtained, the current density-voltage (J-V) characteristics of the elements were evaluated using an SMU2400 type I-V measuring apparatus manufactured by Keithley Instruments, Inc. in a nitrogen atmosphere (oxygen concentration: 1 ppm or less, moisture concentration: 1 ppm or less). Filtered xenon lamp light from a solar simulator manufactured by Oriel Instruments Corp. was used, and an AM1.5G spectrum of 100 mW/cm$^2$ was approximated. The short circuit current (Jsc), open circuit voltage (Voc), fill factor (FF) and power conversion efficiency (η) obtained in the apparatus are presented in the following Table 1.

(2) Retention Ratio of Power Conversion Efficiency after Leaving in the Atmosphere The 2-mm square element obtained as described above was exposed to the light-shielded atmosphere (23° C., 50% RH) for 72 hours, and thereafter, the current density-voltage (J-V) characteristics of the element were evaluated in the same manner as in the above section (1). The retention ratio was determined according the following formula.

The following Table 1 summarizes these results.

Retention ratio(%) of Power conversion efficiency=
(Power conversion efficiency after leaving in the atmosphere)/(Initial power conversion efficiency)×100  [formula A]

(3) Element Size Dependency

Comparison between the initial power conversion efficiency of the 2-mm square element and that of the 20-mm square element, each of which was obtained above, was carried out, and a difference in power conversion efficiency due to enlargement of the element size was calculated using the following formula.

Ratio(%)=(Power conversion efficiency of 20-mm square element)/(Power conversion efficiency of 2-mm square element)×100

TABLE 1

| Sample No. | Polymer in Photoelectric conversion layer Kind | 2-mm square element (initial) | | | | | Remarks |
|---|---|---|---|---|---|---|---|
| | | λmax [nm] | Jsc [mA/cm$^2$] | Voc [V] | FF [%] | η [%] | |
| 101 | Polymer 1 | 680 | 10.6 | 0.74 | 50 | 3.9 | The present invention |
| 102 | Polymer 2 | 680 | 10.8 | 0.74 | 50 | 4.0 | The present invention |
| 103 | Polymer 3 | 670 | 10.2 | 0.71 | 52 | 3.8 | The present invention |
| 104 | Polymer 4 | 660 | 10.0 | 0.70 | 50 | 3.5 | The present invention |
| 105 | Polymer 5 | 680 | 11.3 | 0.74 | 54 | 4.5 | The present invention |
| 106 | Polymer 6 | 690 | 11.0 | 0.70 | 53 | 4.1 | The present invention |
| 107 | Polymer 7 | 670 | 10.3 | 0.70 | 52 | 3.7 | The present invention |
| 108 | Polymer 8 | 680 | 10.2 | 0.71 | 53 | 3.8 | The present invention |
| 109 | Polymer 9 | 660 | 10.0 | 0.70 | 53 | 3.7 | The present invention |
| 110 | Polymer 10 | 660 | 10.1 | 0.71 | 53 | 3.8 | The present invention |
| 111 | Polymer 11 | 660 | 10.0 | 0.70 | 52 | 3.6 | The present invention |
| 112 | Polymer 12 | 690 | 11.1 | 0.74 | 55 | 4.5 | The present invention |
| C11 | Comparative polymer A | 620 | 7.5 | 0.66 | 48 | 2.4 | Comparative example |

TABLE 1-continued

| | | | | | | |
|---|---|---|---|---|---|---|
| C12 | Comparative polymer B | 620 | 7.3 | 0.65 | 47 | 2.2 Comparative example |
| C13 | Comparative polymer C | 650 | 9.5 | 0.65 | 50 | 3.1 Comparative example |
| C14 | Comparative polymer D | 660 | 10.0 | 0.68 | 50 | 3.4 Comparative example |

| Sample No. | 2-mm square element (after leaving in the atmosphere) | | 20-mm square element (initial) | | Remarks |
|---|---|---|---|---|---|
| | η [%] | Retention ratio [%] | η [%] | Retention ratio [%] | |
| 101 | 3.4 | 87 | 3.4 | 87 | The present invention |
| 102 | 3.6 | 90 | 3.5 | 88 | The present invention |
| 103 | 3.4 | 89 | 3.3 | 87 | The present invention |
| 104 | 3.0 | 86 | 2.9 | 83 | The present invention |
| 105 | 3.9 | 87 | 4.0 | 89 | The present invention |
| 106 | 3.5 | 85 | 3.5 | 85 | The present invention |
| 107 | 3.2 | 86 | 3.2 | 86 | The present invention |
| 108 | 3.2 | 84 | 3.2 | 84 | The present invention |
| 109 | 3.1 | 84 | 3.2 | 86 | The present invention |
| 110 | 3.1 | 82 | 3.2 | 84 | The present invention |
| 111 | 3.0 | 83 | 3.0 | 83 | The present invention |
| 112 | 3.9 | 87 | 3.9 | 87 | The present invention |
| C11 | 1.8 | 75 | 1.7 | 71 | Comparative example |
| C12 | 1.4 | 63 | 1.5 | 69 | Comparative example |
| C13 | 2.1 | 68 | 2.2 | 72 | Comparative example |
| C14 | 2.4 | 71 | 2.5 | 73 | Comparative example |

As a result, it can be seen that solar cell elements using the organic semiconductor polymers of the present invention have high power conversion efficiency η, which have a high retention ratio of the power conversion efficiency after leaving in the atmosphere, and in which the decrease in the power conversion efficiency is small when the element size is increased. The same evaluation as the above was carried out using the homopolymers of the above exemplified structure ex 1-11, ex 1-15, or ex 1-16, the copolymer of ex 1-14 and (5) (each of $R^{15}$ and $R^{16}$ represents $C_6H_{13}$), the copolymer of ex 1-14 and (11) (each of $R^{15}$ and $R^{16}$ represents $C_6H_{13}$), the copolymer of ex 1-14 and (17) (each of $R^{15}$ and $R^{16}$ represents H, $R^{18}$ represents $CH_3$, and each of $X^2$ and $Y^1$ represents O) and the copolymer of ex 1-14 and (23). As a result, it was confirmed that good performances in each of the above-described items were obtained by these polymers.

On the other hand, it can be seen that solar cell elements using the organic semiconductor polymers of Comparative Example have low conversion efficiency η, in which the conversion efficiency η after leaving in the atmosphere is prone to decrease, and in which the decrease in the power conversion efficiency is large when the element size is increased.

Having described our invention as related to the present embodiments, it is our intention that the invention not be limited by any of the details of the description, unless otherwise specified, but rather be construed broadly within its spirit and scope as set out in the accompanying claims.

This application is a continuation of PCT/JP2012/073501 filed Sep. 13, 2012 which claims benefit of Japanese Patent Application No. 2011-212371 filed Sep. 28, 2011, incorporated herein by reference in its entirety.

REFERENCE SIGNS LIST

7 Transparent support
10 Bulk hetero junction organic photovoltaic cell
11 Transparent electrode (first electrode)
12 Counter electrode (second electrode)
21 Hole transport layer
22 Electron transport layer
3 Photoelectric conversion layer
31 p-type semiconductor layer
32 n-type semiconductor layer
L Light
P Electric motor (electric fan)

The invention claimed is:

1. An organic photovoltaic cell, comprising:
   a first electrode;
   a second electrode: and
   a photoelectric conversion layer between the first electrode and the second electrode,
   wherein the photoelectric conversion layer contains a polymer having a structural unit represented by formula (I):

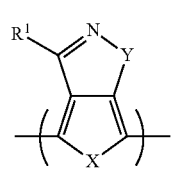

(I)

wherein X represents S, $NR^2$, O, Se or Te; Y represents $NR^2$, O, Te, SO, $SO_2$ or CO; and $R^1$ and $R^2$ represent a hydrogen atom or a substituent.

2. The organic photovoltaic cell according to claim 1, wherein the polymer is a copolymer.

3. The organic photovoltaic cell according to claim 2, wherein a copolymer component in the copolymer contains a structure represented by any one of formulae (II-1) to (II-7):

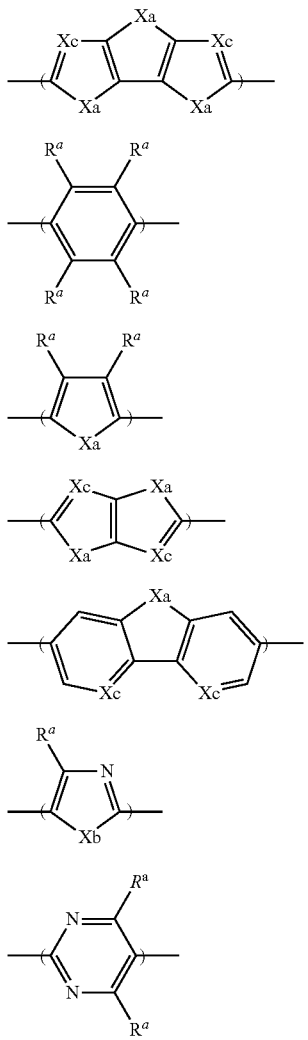

wherein Xa represents $C(R^a)_2$, $Si(R^a)_2$, S, Se, SO, $SO_2$ or CO; Xb represents NH, O, or S; Xc represents $CR^a$ or N; $R^a$ represents a hydrogen atom or a substituent; and plural $R^a$'s may be linked or condensed to form a ring.

4. The organic photovoltaic cell according to claim 1, wherein the photoelectric conversion layer contains an n-type organic semiconductor compound.

5. The organic photovoltaic cell according to claim 4, wherein the n-type organic semiconductor compound is a fullerene or a derivative thereof.

6. The organic photovoltaic cell according to claim 5, wherein the fullerene or the derivative thereof is a phenyl-$C_{61}$-butyric acid ester, a diphenyl-$C_{62}$-bis(butyric acid ester), a phenyl-$C_{71}$-butyric acid ester, a phenyl-$C_{85}$-butyric acid ester, or a thienyl-$C_{61}$-butyric acid ester.

7. The organic photovoltaic cell according to claim 1, comprising a hole transport layer between the first electrode and the photoelectric conversion layer.

8. The organic photovoltaic cell according to claim 1, comprising an electron transport layer between the second electrode and the photoelectric conversion layer.

9. The organic photovoltaic cell according to claim 1, wherein the first electrode is a transparent electrode.

10. The organic photovoltaic cell according to claim 1, wherein the second electrode is a metal electrode.

11. A polymer, comprising a structural unit represented by formula (I):

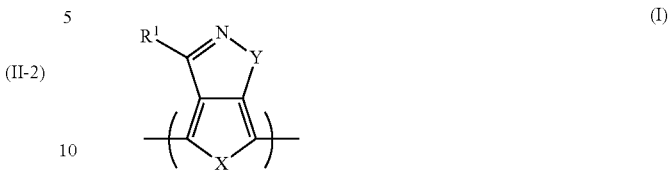

wherein X represents S, $NR^2$, O, Se or Te; Y represents $NR^2$, O, Te, SO, $SO_2$, or CO; and $R^1$ and $R^2$ represent a hydrogen atom or a substituent.

12. The polymer according to claim 11, wherein the polymer is a copolymer.

13. The polymer according to claim 12, wherein a copolymer component in the copolymer contains a structure represented by any one of formulae (II-1) to (II-7):

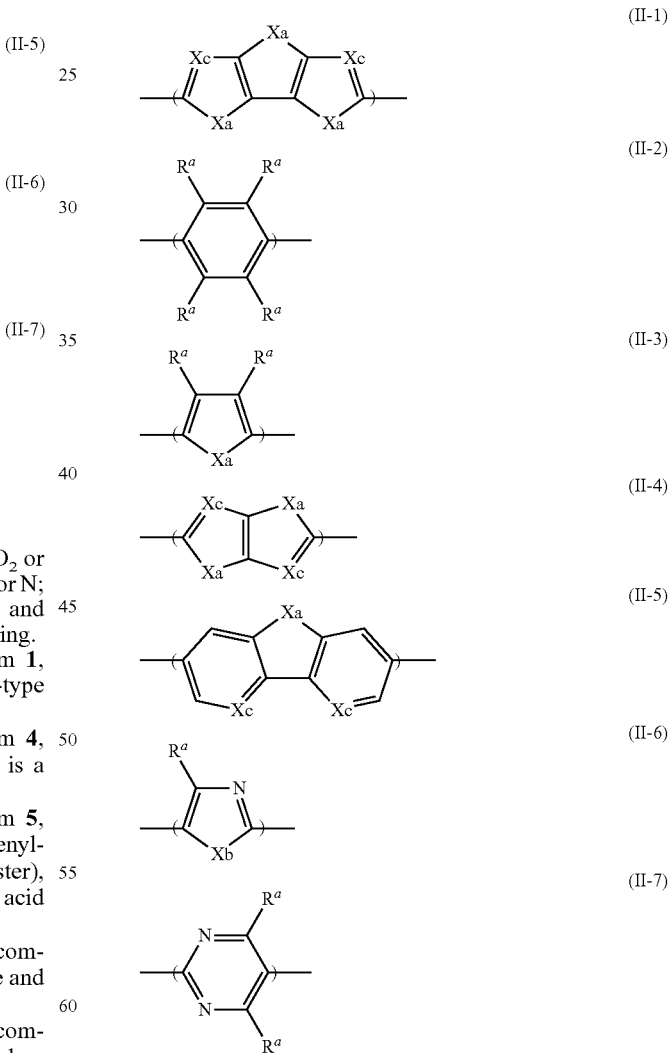

wherein Xa represents $C(R^a)_2$, $Si(R^a)_2$, S, Se, SO, $SO_2$ or CO; Xb represents NH, O, or S; Xc represents $CR^a$ or N; $R^a$ represents a hydrogen atom or a substituent; and plural $R^a$'s may be linked or condensed to form a ring.

14. A composition for organic semiconductor material, comprising:
the polymer according to claim 11; and
fullerene or a derivative thereof.

* * * * *